(12) United States Patent
Fu et al.

(10) Patent No.: US 9,680,051 B2
(45) Date of Patent: Jun. 13, 2017

(54) LIGHT EMITTING DIODE WITH QUANTUM BARRIER DOPING

(71) Applicant: Industrial Technology Research Institute, Hsinchu (TW)

(72) Inventors: Yi-Keng Fu, Hsinchu County (TW); Yu-Hsuan Lu, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 191 days.

(21) Appl. No.: 14/265,371

(22) Filed: Apr. 30, 2014

(65) Prior Publication Data

US 2014/0231747 A1 Aug. 21, 2014

Related U.S. Application Data

(60) Division of application No. 13/727,619, filed on Dec. 27, 2012, now abandoned, which is a
(Continued)

(30) Foreign Application Priority Data

Mar. 1, 2012 (TW) .............................. 101106753 A
Apr. 12, 2012 (TW) .............................. 101113026 A
Oct. 12, 2012 (TW) .............................. 101137771 A

(51) Int. Cl.
*H01L 33/06* (2010.01)
*H01L 33/04* (2010.01)

(52) U.S. Cl.
CPC .............. *H01L 33/06* (2013.01); *H01L 33/04* (2013.01)

(58) Field of Classification Search
CPC .................................. H01L 33/06; H01L 33/04
See application file for complete search history.

(56) References Cited

U.S. PATENT DOCUMENTS

2004/0051107 A1* 3/2004 Nagahama ............. B82Y 20/00
257/79
2005/0067613 A1* 3/2005 Kim ....................... B82Y 20/00
257/14
(Continued)

FOREIGN PATENT DOCUMENTS

TW 536859 6/2003
TW 200733423 9/2007
(Continued)

OTHER PUBLICATIONS

"Office Action of Taiwan Counterpart Application", issued on Sep. 1, 2014, p. 1-p. 8, in which the listed references were cited.

*Primary Examiner* — Matthew Landau
*Assistant Examiner* — Mark Hatzilambrou
(74) *Attorney, Agent, or Firm* — Jianq Chyun IP Office

(57) ABSTRACT

A light emitting diode including a substrate, a p-type and n-type semiconductor layers, an active layer, an interlayer, an electron barrier layer, a first and a second electrodes are provided. The n-type semiconductor layer is disposed on the sapphire substrate. The active layer has an active region with a defect density greater than or equal to $2 \times 10^7 / cm^2$. The active layer is disposed between the n-type and p-type semiconductor layers. The wavelength of light emitted by the active layer is $\lambda$, and 222 nm$\leq \lambda \leq$405 nm. The active layer includes i quantum barrier layers and (i-1) quantum wells, each quantum well is disposed between any two quantum barrier layers, and i$\geq$2. N-type dopant is doped in at least k layers of the i quantum barrier layers, wherein k is a natural number and k$\geq$1, when i even, k$\geq$i/2, and when i is odd, k$\geq$(i-1)/2.

18 Claims, 24 Drawing Sheets

Related U.S. Application Data continuation-in-part of application No. 13/481,966, filed on May 29, 2012, now abandoned, and a continuation-in-part of application No. 13/469,070, filed on May 10, 2012, now abandoned.

(56) References Cited

U.S. PATENT DOCUMENTS

| | | | |
|---|---|---|---|
| 2011/0017976 A1* | 1/2011 | Khan | B82Y 20/00 257/13 |
| 2011/0187294 A1* | 8/2011 | Bergmann | H01L 33/04 315/363 |

FOREIGN PATENT DOCUMENTS

| | | | | |
|---|---|---|---|---|
| TW | 201130157 | | 9/2011 | |
| TW | 201133925 | | 10/2011 | |
| WO | WO-2011/014822 A2 * | | 2/2011 | H01L 33/06 |

* cited by examiner

LIGHT EMITTING DIODE WITH QUANTUM BARRIER DOPING

CROSS-REFERENCE TO RELATED APPLICATION

This is a divisional application of patent application Ser. No. 13/727,619, filed on Dec. 27, 2012, wherein the patent application Ser. No. 13/727,619 is a continuation-in-part application of and claims the priority benefit of U.S. applications Ser. Nos. 13/481,966 and 13/469,070, respectively filed on May 29, 2012 and May 10, 2012, now pending. The U.S. application Ser. No. 13/481,966 claims the priority benefit of Taiwan application serial no. 101113026, filed on Apr. 12, 2012. The U.S. application Ser. No. 13/469,070 claims the priority benefit of Taiwan application serial no. 101106753, filed on Mar. 1, 2012. The patent application Ser. No. 13/727,619 also claims the priority benefit of Taiwan application serial no. 101137771, filed on Oct. 12, 2012. The entirety of each of the above-mentioned patent applications is hereby incorporated by reference herein and made a part of this specification.

TECHNICAL FIELD

The disclosure relates to a light emitting diode (LED), and more particularly, to an LED capable of enhancing luminous intensity.

BACKGROUND

A light emitting diode (LED) is a semiconductor device constituted mainly by group III-V compound semiconductor materials, for instance. Such semiconductor materials have a characteristic of converting electricity into light. Hence, when a current is applied to the semiconductor materials, electrons therein would be combined with holes and release excessive energy in a form of light, thereby achieving an effect of luminosity.

Generally speaking, since the nitride-based material served as an active-layer material in the LED has direct bandgap (Eg) from the deep ultraviolet (UV) waveband to the far-infrared waveband (6.2 eV to 0.7 eV), the nitride-based material in the conventional technique fabricated the LED with wavelengths ranging from green to ultraviolet, so as to be characterized by high internal quantum efficiency (IQE). Conventionally, in order to enhance the carrier confinement effects, one electron barrier layer is formed after the growth of the quantum barrier layer closest to the p-type semiconductor layer, so as to enhance the overall luminous intensity of the LED. However, the mismatch phenomenon of the polarization field is caused due to the difference in the lattice constants between the electron barrier layer and the quantum barrier layer closest to the p-type semiconductor layer, and thus fine carrier confinement effects can not be achieved and the hole injection efficiency is reduced, thereby decreasing the luminous efficiency. As a result, manufacturers in the pertinent art endeavour to develop LED with satisfactory luminous efficiency.

SUMMARY

A light emitting diode (LED) is provided in the disclosure. By having the layer number of the quantum barrier layers doped with n-type dopants satisfying a specific proportion, the luminous efficiency of the LED at the 222 nm-405 nm wavelength range can be enhanced.

Another LED is provided in the disclosure. By having the lowest doping concentration at the quantum barrier layer doped with n-type dopants that is closest to the p-type semiconductor, the luminous efficiency of the LED at the 222 nm-405 nm wavelength range can be enhanced.

An LED is provided in the disclosure. By having the doping concentrations of the quantum barrier layers doped with n-type dopants satisfying a specific relationship, the luminous efficiency of the LED at the 222 nm-405 nm wavelength range can be enhanced.

The disclosure provides an LED, including a substrate, a n-type semiconductor layer, an active layer, a p-type semiconductor layer, a first electrode, and a second electrode. The n-type semiconductor layer is disposed on the substrate. The active layer has an active region with a defect density DD, in which $DD \geq 2 \times 10^7/cm^2$. The active layer is disposed on a portion of the n-type semiconductor layer, and a wavelength $\lambda$ of light emitted by the active layer is 222 nm$\leq \lambda \leq$405 nm. The active layer includes i quantum barrier layers and (i−1) quantum wells. Each of the quantum wells is disposed between any two quantum barrier layers, and i is a natural number greater than or equal to 2, in which a n-type dopant is doped in at least k layers of the quantum barrier layers, k being a natural number greater than or equal to 1, when i is an even number, k$\geq$i/2, and when i is an odd number, k$\geq$(i−1)/2. The p-type semiconductor layer is disposed on the active layer, wherein the doping concentration of the each of the k quantum barrier layers counting sequentially from the n-type to the p-type semiconductor layer side are $C_1, C_2, \ldots C_k$, where $C_k < C_{k-1}$. The first electrode is disposed on a portion of the n-type semiconductor layer, and the second electrode is disposed on a portion of the p-type semiconductor layer.

The disclosure provides another LED, including a substrate, a n-type semiconductor layer, an active layer, a p-type semiconductor layer, a first electrode, and a second electrode. The n-type semiconductor layer is disposed on the substrate. The active layer has an active region with a defect density DD, in which $DD \geq 2 \times 10^7/cm^2$. The active layer is disposed on a portion of the n-type semiconductor layer, and a wavelength $\lambda$ of light emitted by the active layer is 222 nm$\leq \lambda \leq$405 nm. The active layer includes i quantum barrier layers and (i−1) quantum wells. Each of the quantum wells is disposed between any two quantum barrier layers, and i is a natural number greater than or equal to 2, in which a n-type dopant is doped in at least k layers of the quantum barrier layers, k being a natural number greater than or equal to 1, when i is an even number, k$\geq$i/2 and when i is an odd number, k$\geq$(i−1)/2. The p-type semiconductor layer is disposed on the active layer, and a doping concentration of the quantum barrier layer in the k quantum barrier layers nearest to the p-type semiconductor layer is less than the doping concentration of the other quantum barrier layers in the k quantum barrier layers. The first electrode is disposed on a portion of the n-type semiconductor layer, and the second electrode is disposed on a portion of the p-type semiconductor layer.

The disclosure provides another LED, including a substrate, a n-type semiconductor layer, an active layer, a p-type semiconductor layer, a first electrode, and a second electrode. The active layer has an active region with a defect density DD, in which $DD \geq 2 \times 10^7/cm^2$. The n-type semiconductor layer is disposed on the substrate. The active layer is disposed on a portion of the n-type semiconductor layer, and a wavelength $\lambda$ of light emitted by the active layer is 222 nm$\leq \lambda \leq$405 nm. The active layer includes i quantum barrier layers and (i−1) quantum wells. Each of the quantum wells is disposed between any two quantum barrier layers, and i is a natural number greater than or equal to 2, in which a n-type dopant is doped in at least k layers of the quantum barrier layers, k being a natural number greater than or equal to 1, when i is an even number, k≥i/2, when i is an odd number, k≥(i−1)/2, and a doping concentration of the k quantum barrier layers is from $5\times10^7/cm^3$ to $1\times10^{19}/cm^3$. The doping concentration of the each of the k quantum barrier layers counting sequentially from the n-type to the p-type semiconductor layer side are $C_1, C_2, \ldots C_k$, where $C_k<C_{k-1}$. The p-type semiconductor layer is disposed on the active layer. The first electrode is disposed on a portion of the n-type semiconductor layer, and the second electrode is disposed on a portion of the p-type semiconductor layer.

In summary, in the LED according to the embodiments of the disclosure, by having a number of quantum barrier layers of the active layer doped with n-type dopants, in which the layer number of the doped quantum barrier layers satisfies a specific relationship, or by having the lowest doping concentration at the quantum barrier layer doped with n-type dopants closest to the p-type semiconductor, or by having the doping concentrations of the quantum barrier layers doped with n-type dopants satisfying a specific relationship, the n-type dopants can compensate for the effect which defects have on the carriers. Accordingly, the carrier recombination rate of the LED can be enhanced. Therefore, by employing any one of the afore-described techniques, the luminous efficiency of the LED in the disclosure can be drastically increased at the 222 nm-405 nm wavelength range.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
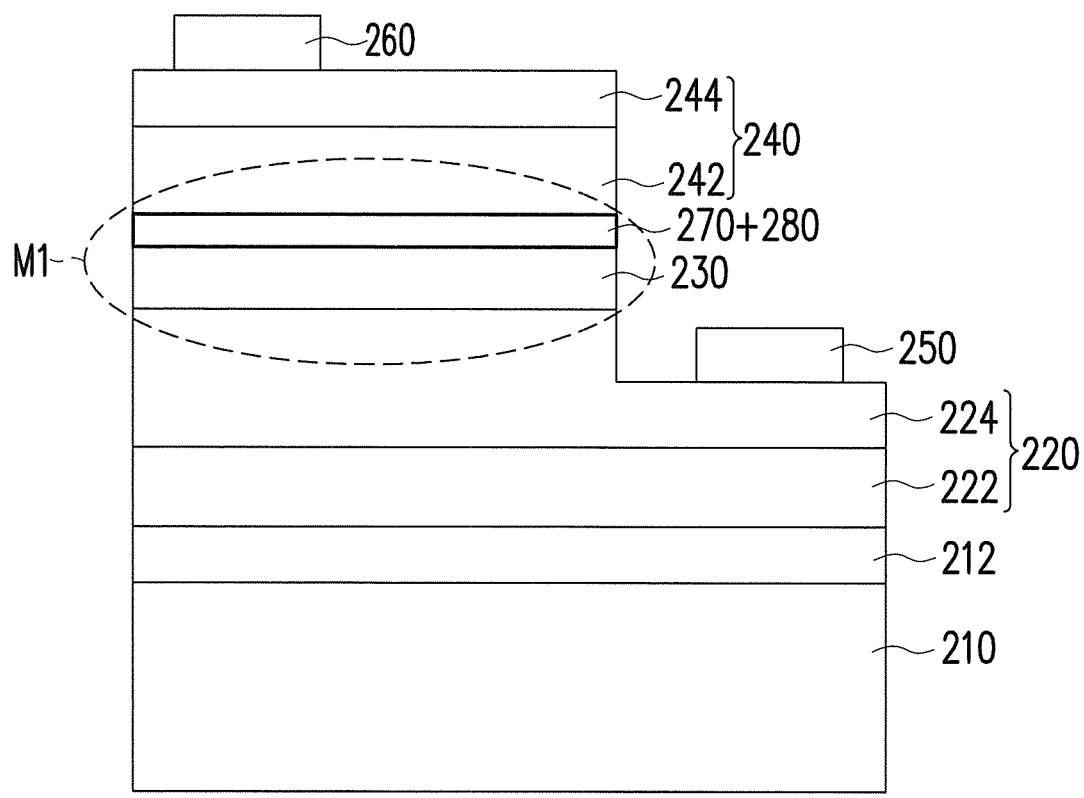
FIG. 1A is a schematic cross-sectional diagram illustrating an LED according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
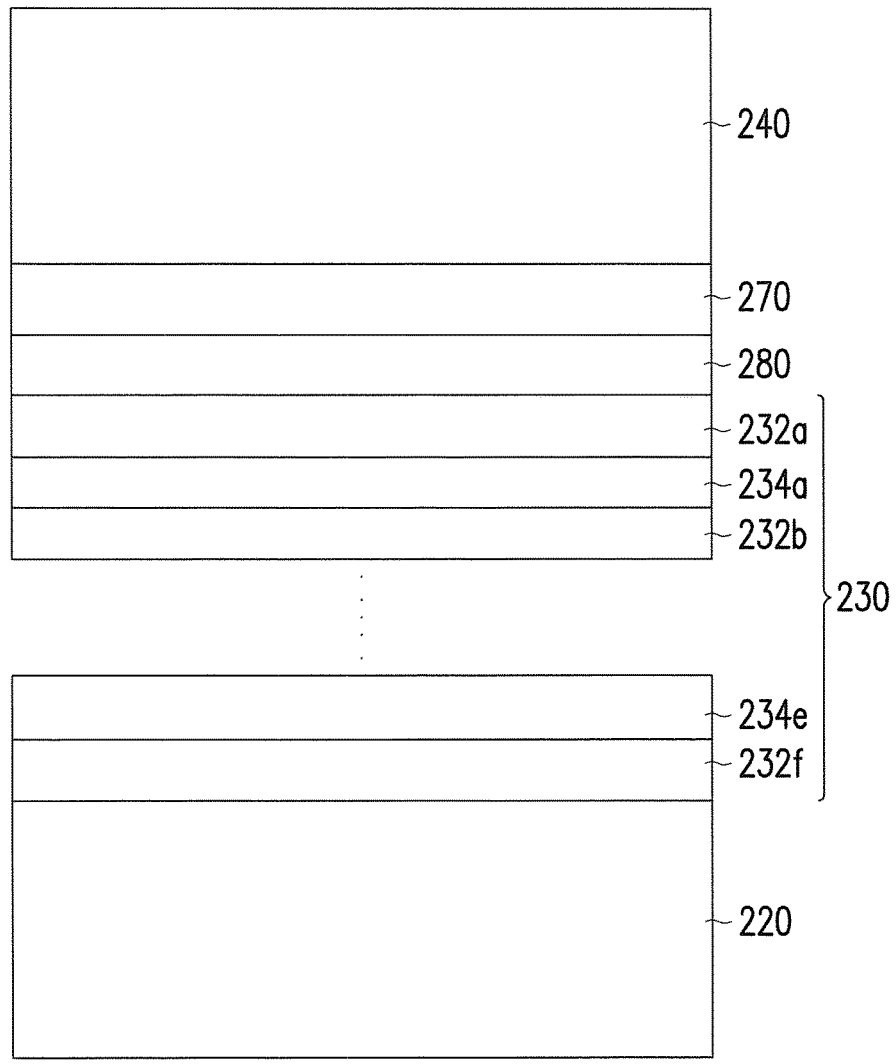
FIG. 1B is a schematic enlarged diagram illustrating a portion of the layers depicted in FIG. 1A.

FIG. 1A is a schematic cross-sectional diagram illustrating an LED according to an exemplary embodiment, and FIG. 1B is a schematic enlarged diagram illustrating a portion of the layers at M1 depicted in FIG. 1A.

Referring to FIG. 1A, an LED 200 includes a substrate 210, an n-type semiconductor layer 220, an active layer 230, a p-type semiconductor layer 240, a first electrode 250, and a second electrode 260. The substrate 210 is, for instance, a sapphire substrate. Specifically, the stacking layers of a nitride semiconductor capping layer 212 (e.g. un-doped GaN), an n-type semiconductor layer 220, an active layer 230 and a p-type semiconductor layer 240 are formed in sequence on a surface of the sapphire substrate 210. The active layer 230 is disposed between the n-type semiconductor layer 220 and the p-type semiconductor layer 240. The n-type semiconductor layer 220 may include the stacking layers of a first n-type doped GaN layer 222 and a second n-type doped GaN layer 224 disposed sequentially on the nitride semiconductor capping layer 212. The p-type semiconductor layer 240 may include the stacking layers of a first p-type doped GaN layer 242 and a second p-type doped GaN layer 244 disposed sequentially on the active layer 230. A difference between the first n-type doped GaN layer 222 and the second n-type doped GaN layer 224, or a difference between the first p-type doped GaN layer 242 and the second p-type doped GaN layer 244 may be in thickness or in doping concentration. In addition, a material of the n-type semiconductor layer 220 and the p-type semiconductor layer 240 may be AlGaN, for instance. According to requirements in practice, people skilled in the art may select the thickness, the doping concentration, and the aluminium concentration for growth of the nitride semiconductor capping layer 212, the first n/p-type doped GaN layers 222 and 242, the second nip-type doped GaN layers 224 and 244, although the disclosure is not limited thereto.

Specifically, as shown in FIG. 1, the nitride semiconductor capping layer 212 (e.g. un-doped GaN), the first n-type doped GaN layer 222 and the second n-type doped GaN layer 224, the active layer 230, the first p-type doped GaN layer 242, and the second p-type doped GaN layer 244 are formed in sequence on the sapphire substrate 210. Moreover, the first electrode 250 and the second electrode 260 are respectively formed on a portion of the second n-type doped GaN layer 224 and the second p-type doped GaN layer 244, such that the first electrode 250 is electrically connected to the n-type semiconductor layer 220, and the second electrode 260 is electrically connected to the p-type semiconductor layer 240. Certainly, a nitride buffer layer may also be added between the sapphire substrate and the n-type semiconductor, although the disclosure is not limited thereto.

Figure 2A:
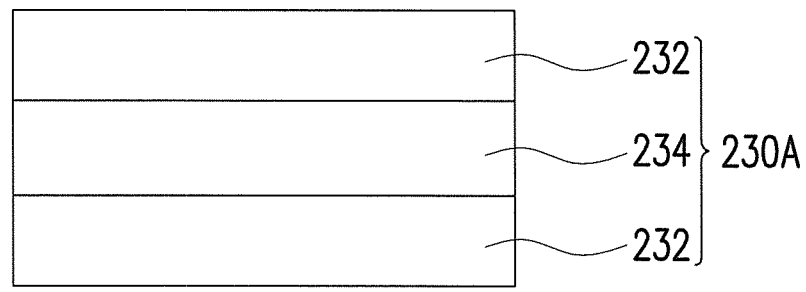
FIG. 2A is a schematic cross-sectional diagram illustrating a single quantum well active layer in an LED according to an exemplary embodiment.
Figure 2B:
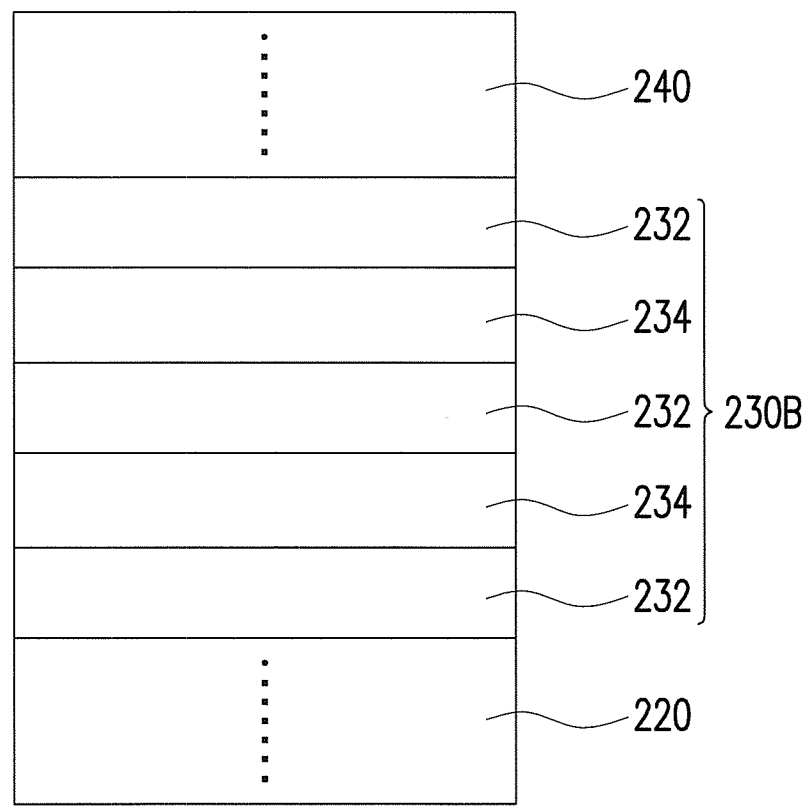
FIG. 2B is a schematic cross-sectional diagram illustrating a multi-quantum well active layer in an LED according to an exemplary embodiment.

The active layer 230, as shown in FIG. 2A and FIG. 2B, may comprise a single quantum well (i.e., a single quantum well active layer 230A) or multiple quantum wells (i.e., a multi-quantum well active layer 230B). FIG. 2A is a schematic cross-sectional diagram illustrating a single quantum well active layer in an LED according to an exemplary embodiment. FIG. 2B is a schematic cross-sectional diagram illustrating a multi-quantum well active layer in an LED according to an exemplary embodiment. Generally speaking, the active layer 230 includes i quantum barrier layers and (i−1) quantum wells. Each of the quantum wells is located between any two quantum barrier layers, and i is a natural number greater than or equal to 2. For instance, as shown in FIG. 2A, the single quantum well active layer 230A may be formed by two quantum barrier layers 232 and a quantum well 234 sandwiched therebetween, thus constituting a quantum barrier layer 232/quantum well 234/quantum barrier layer 232 structure. Taking the LED 200 with an emitted wavelength of 222 nm-405 nm as an example, a material of the quantum barrier layers 232 is $Al_xIn_yGa_{1-x-y}N$, wherein $0 \leq x \leq 1$, $0 \leq y \leq 0.3$, and $x+y \leq 1$. Moreover, a material of the quantum well 234 may be $Al_mIn_nGa_{1-m-n}N$, wherein $0 \leq m < 1$, $0 \leq n \leq 0.5$, $m+n \leq 1$, $x>m$, and $n \geq y$. According to requirements in practice, such as different emitted wavelengths, people skilled in the art may select the concentrations of m and n or x and y for growth, although the disclosure is not limited thereto.

On the other hand, the active layer 230, as shown in FIG. 2B, may comprise multiple quantum wells (i.e., the multi-quantum well active layer 230B). The multi-quantum well active layer 230B may be Ruined by at least two pairs of stacked quantum barrier layers 232 and quantum wells 234, as shown in FIG. 2B. For instance, in FIG. 2B, the multi-quantum well active layer 230B comprises three pairs of stacked quantum barrier layers 232/quantum wells 234.

Figure 3A:
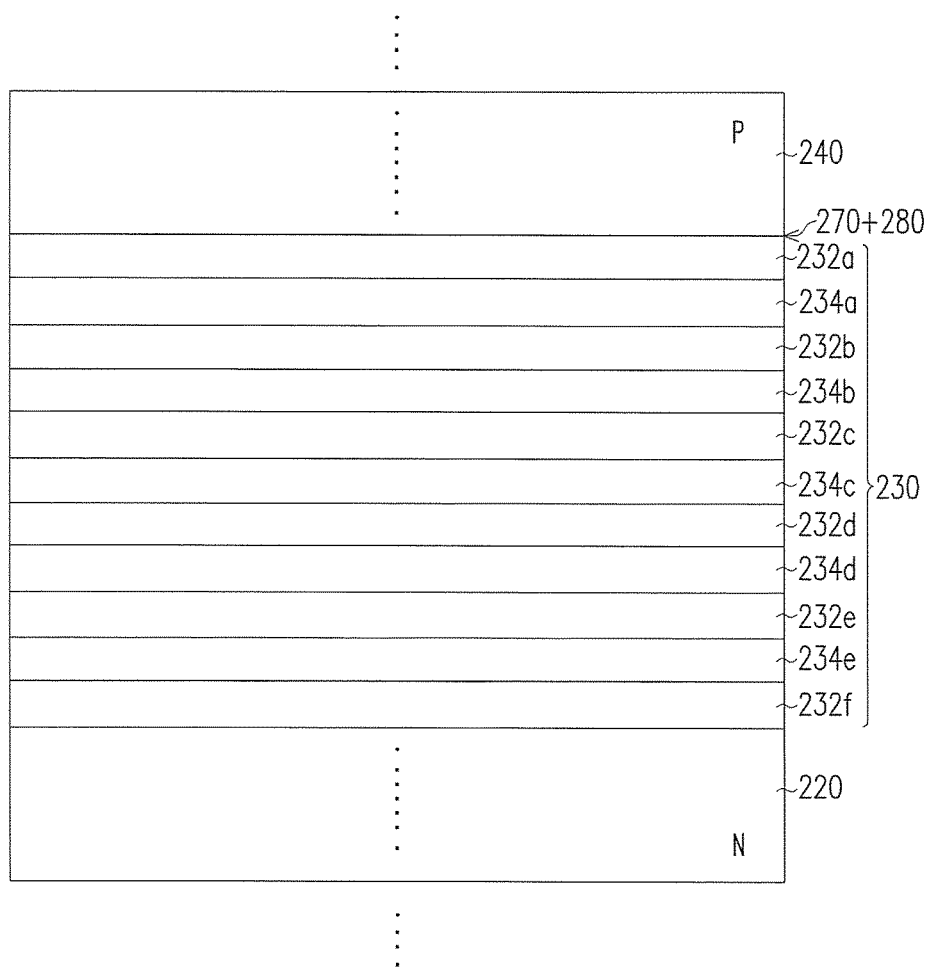
FIG. 3A and FIG. 3B are enlarged schematic cross-sectional diagrams illustrating an active layer in an LED according to an exemplary embodiment.
Figure 3B:
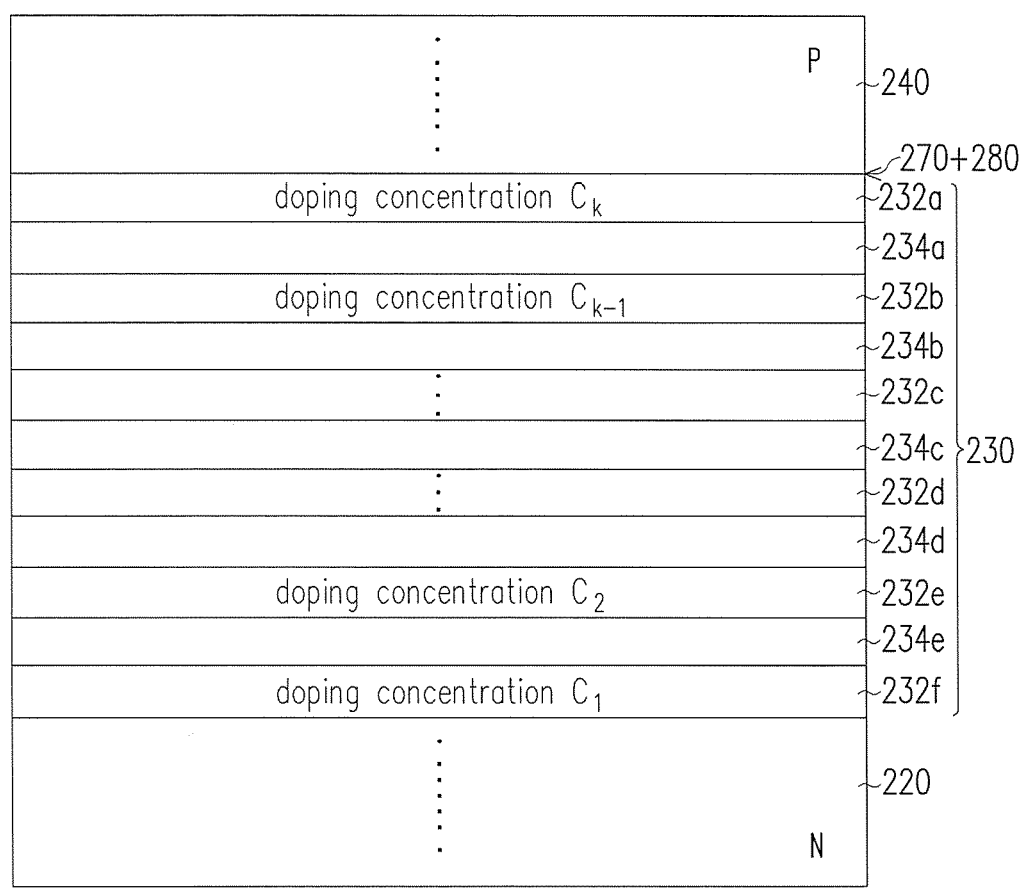

FIG. 3A is an enlarged schematic cross-sectional diagram illustrating an active layer in an LED according to an exemplary embodiment; and FIG. 3B is an enlarged schematic cross-sectional diagram illustrating an active layer in an LED according to an exemplary embodiment, which shows the doping concentration $C_1$ to $C_k$ when the doping layer number k equals to the overall layer number i. As shown in FIG. 3A and FIG. 3B, the active layer 230 described in the present embodiment includes six quantum barrier layers and five quantum wells, for instance. Each of the quantum wells is located between any two of the quantum barrier layers. The quantum barrier layers counting from the p-type semiconductor layer 240 are sequentially 232a, 232b, 232c, 232d, 232e, and 232f, and the quantum wells counting from the p-type semiconductor layer 240, are the quantum wells 234a, 234b, 234c, 234d, and 234e, sequentially.

Referring to FIG. 3A, FIG. 3B, and FIG. 1B, it should be mentioned that, the electron barrier layer 270, adjacent to the p-type semiconductor layer 240, is inserted between the active layer 230 and the p-type semiconductor layer 240. Moreover, the interlayer 280 is inserted between the electron barrier layer 270 and the quantum barrier layer 232 closest to the p-type semiconductor layer 240 in the active layer 230 (as shown in FIG. 3, the quantum barrier layer closest to the p-type semiconductor layer 240 in the active layer 230 is labelled as 232a hereafter), such that the two surfaces of the interlayer 280 are in contact with the quantum barrier layer 232a and the electron barrier layer 270. By employing any one of the afore-described techniques such as varying the lattice constant or the thickness of the interlayer 280, the lattice constant a2 of the interlayer 280 may satisfy the specific relationship with the lattice constant a1 of the quantum barrier layer 232a or the lattice constant a3 of the electron barrier layer 270, so as to control the energy bands of the conductive band and the valence band of the quantum barrier layer closest to the p-type semiconductor layer 232a in the active layer 230 connected to the electron barrier layer 270. Alternatively, by having the thickness t2 of the interlayer 280 to satisfy the specific relationship with the thickness t3 of the electron barrier layer 270, the energy bands of the conductive band and the valence band of the quantum barrier layer closest to the p-type semiconductor layer 232a in the active layer 230 connected to the electron barrier layer 270 may also be controlled so as to improve the hole injection efficiency, thereby enhancing the overall luminous efficiency of the LED 200.

Specifically, the lattice constants described in the disclosure may be defined as average lattice constants, and from the conventional lattice constant formula, $Al_aIn_bGa_{1-a-b}N$, the lattice constants may be calculated as $3.112 \times a + 3.544 \times b + 3.1892 \times (1-a-b)$. In the case of b=0, when the aluminium concentration, a, is equal to 0.08, the corresponding lattice constant is 3.1830 Å. When the structure comprises multiple layers, such as $Al_cIn_dGa_{1-c-d}N$ having the thickness $t_1$ and $Al_eIn_fGa_{1-e-f}N$ having the thickness $t_2$, the lattice constants corresponding to $Al_cIn_dGa_{1-c-d}N$ and $Al_eIn_fGa_{1-e-f}N$ are $a_1$ and $a_2$, and the average lattice constant for such structure is:

$$\frac{(a_1 \times t_1 + a_2 \times t_2)}{t_1 + t_2}.$$

Specifically, when the electron barrier layer 270 is inserted between the active layer 230 and the p-type semiconductor layer 240, the carrier confinement effects in the LED may be improved so as to enhance the luminous efficiency of the LED. Moreover, in the disclosure, the interlayer 280 is inserted between the electron barrier layer 270 and the quantum barrier layer closest to the p-type semiconductor layer 232a. In an embodiment, the interlayer 280 may be in the form of graded interlayer. In another embodiment, the interlayer 280 may be in the form of polarization field reversal interlayer. Specifically, by varying the lattice constant or/and thickness of the interlayer 280, the energy bands of the conductive band and the valence band of the quantum barrier layer closest to the p-type semiconductor layer 232a in the active layer 230 connected to the electron barrier layer 270 may be effectively controlled to prevent the mismatch phenomenon of the polarization field that is caused by the difference in the lattice constants between the electron barrier layer and the quantum barrier layer closest to the p-type semiconductor layer, such that the conductive band energy level is higher than the Fermi energy level, thereby improving the electron confinement effects and reducing electron overflow. Moreover, the energy band discontinuity between the electron barrier layer and the quantum barrier layer closest to the p-type semiconductor layer may be removed from the valence band, thereby facilitating the hole injection and enhancing the luminous efficiency effectively. Particularly, the enhancement effect is especially pronounced for the emitted light from the active layer 230 having a wavelength range from 222 nm to 405 nm.

The effects of the LED 200 in the disclosure are further illustrated with support from the experimental results described below. In the embodiments hereafter, nitride semiconductor including aluminium is used as the material of the electron barrier layer and the quantum barrier layers, and the modulation of aluminium concentrations in the layers for controlling the lattice constant of the layers is illustrated, while people skilled in the art may apply other materials to substitute the nitride semiconductor including aluminium of the embodiments in the disclosure, and may also use other elements in the same group IIIA as aluminium to substitute the aluminium which also can implement the embodiments of the disclosure.

First Embodiment

In the embodiments of the disclosure where the emission wavelength is 365 nm, the material of the quantum wells is $In_cGa_{1-c}N$, in which $0 \le c \le 0.05$, and the material of the quantum barrier layers is $Al_dGa_{1-d}N$, in which $0 \le d \le 0.25$. In the present embodiment, the preferable aluminium concentration is 0.10-0.20, and the thickness of the quantum barrier layer is, for instance, 5 nm-15 nm. The preferable thickness is 6 nm-11 nm in the present embodiment. The material of the first p-type doped GaN layer is $Al_eGa_{1-e}N$, in which e is 0-0.15. In the present embodiment, the preferable aluminium concentration, e, is 0.04-0.08, and the thickness of the first p-type doped GaN layer is, for instance, 40 nm-200 nm. The preferable thickness is 60 nm-160 nm in the present embodiment. The material of the second p-type doped GaN layer is $Al_fGa_{1-f}N$, in which f is 0-0.10. Gallium nitride is used in the present embodiment.

Figure 4A:
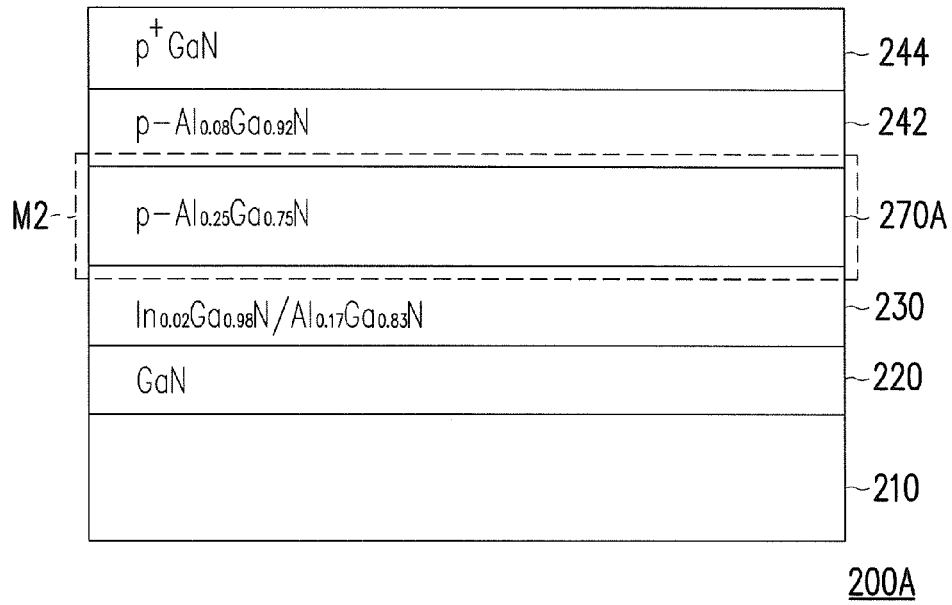
FIG. 4A to FIG. 4D respectively are schematic diagrams illustrating structure pattern of the LEDs according to a first embodiment.
Figure 4B:
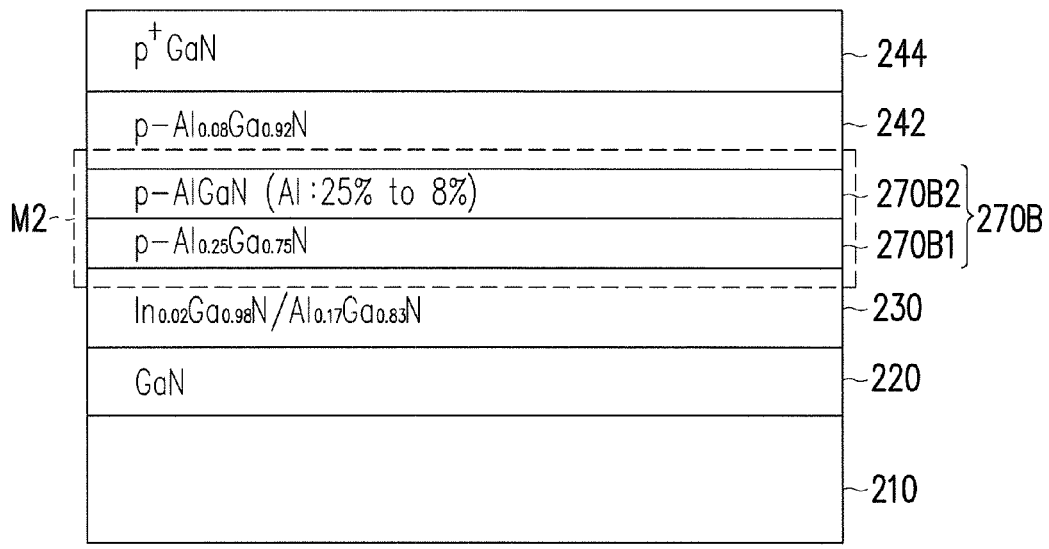
Figure 4C:
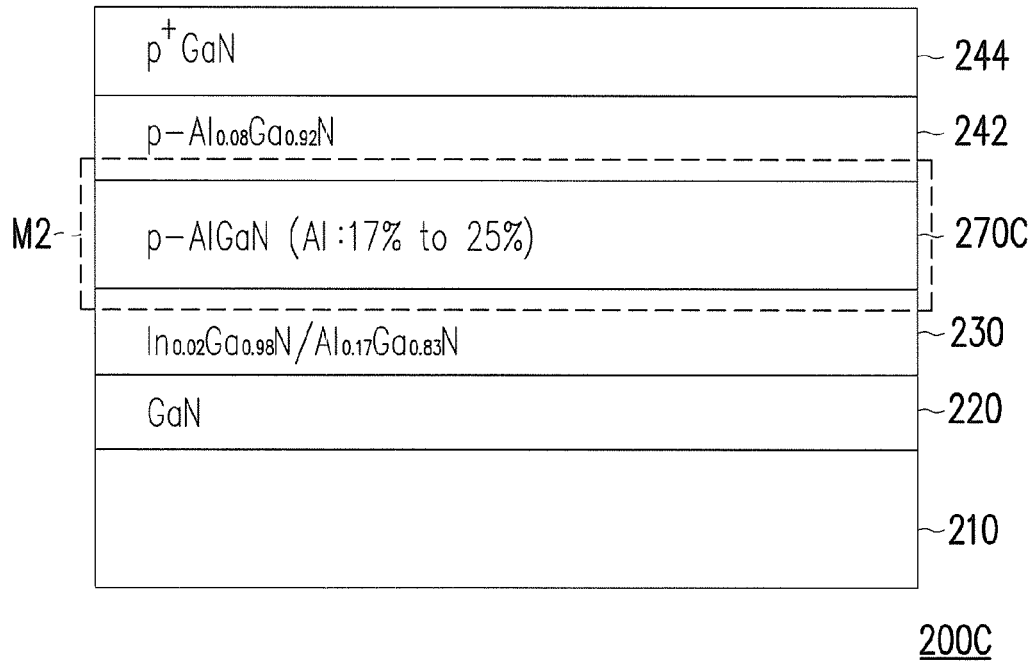
Figure 4D:
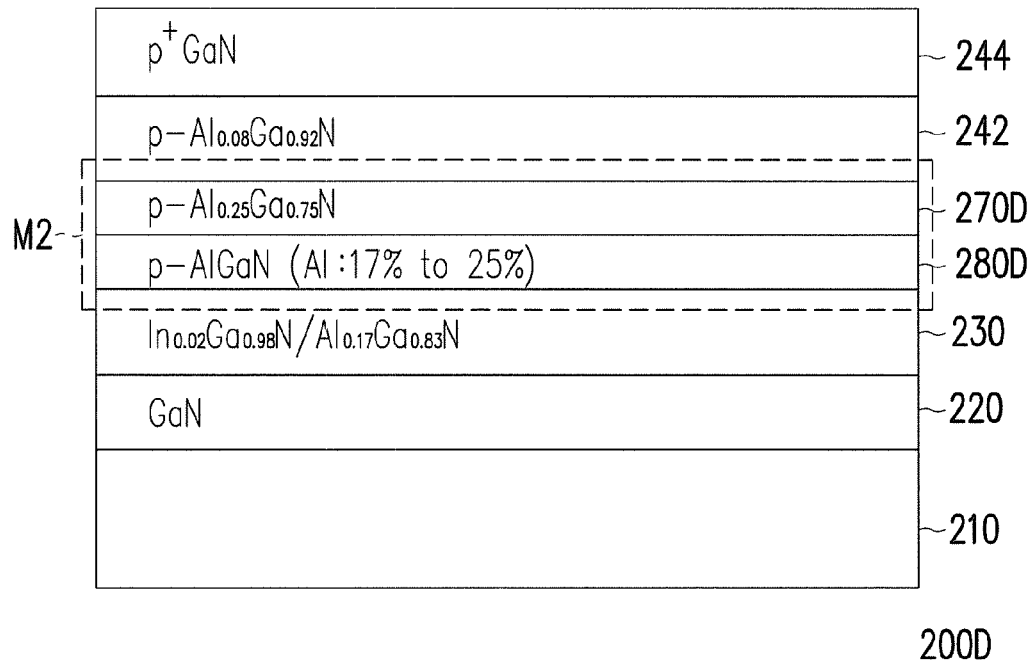

FIG. 4A to FIG. 4D respectively are schematic diagrams illustrating structures of the LEDs, in which FIG. 4D is the structure of an LED according to the first embodiment, and FIG. 4A to FIG. 4C serve as the comparative examples for the LED in the first embodiment. The details of layer structure in the LEDs 200A-200D depicted in FIG. 4A to FIG. 4D are clearly illustrated in the structures depicted in FIG. 1A and FIG. 1B, and thus a brief description of the relative locations among a portion of the layers and the material of each layer, is illustrated in FIG. 4A to FIG. 4D. Each layer material depicted in FIG. 4A to FIG. 4D is represented by the elementary composition, for instance, the material of the first p-type doped GaN layer 242 in the LEDs 200A-200D is $Al_{0.08}Ga_{0.92}N$, the material of the quantum barrier layers in the active layer 230 is $Al_dGa_{1-d}N$, and the material of the quantum wells is $In_cGa_{1-c}N$. Moreover, the material of the second p-type doped GaN layer 244 and the n-type semiconductor layer 220 are, for instance, $P^+GaN$ and GaN, respectively. Referring to FIG. 4A to FIG. 4D, the difference among the LEDs 200A-200D is the sandwich structure between the first p-type doped GaN layer 242 and the active layer 230, which is the layer structure and the elements indicated at M2 in FIG. 4A to FIG. 4D.

Figure 5A:
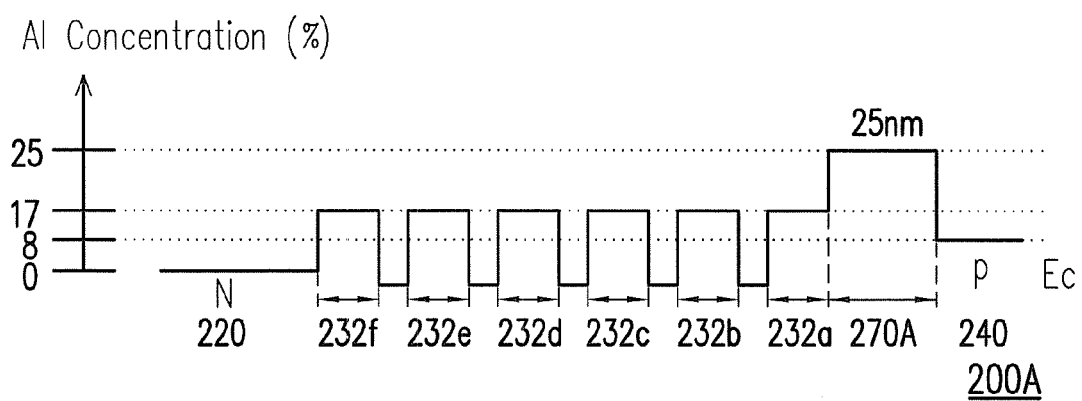
FIG. 5A to FIG. 5D respectively are structural diagrams illustrating several LEDs of the LEDs depicted in FIG. 4A to FIG. 4D.
Figure 5B:
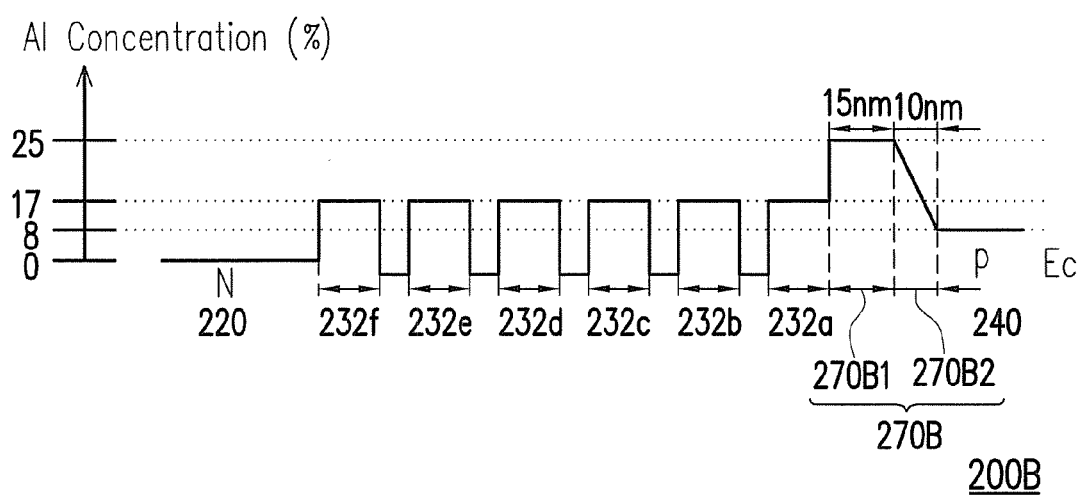
Figure 5C:
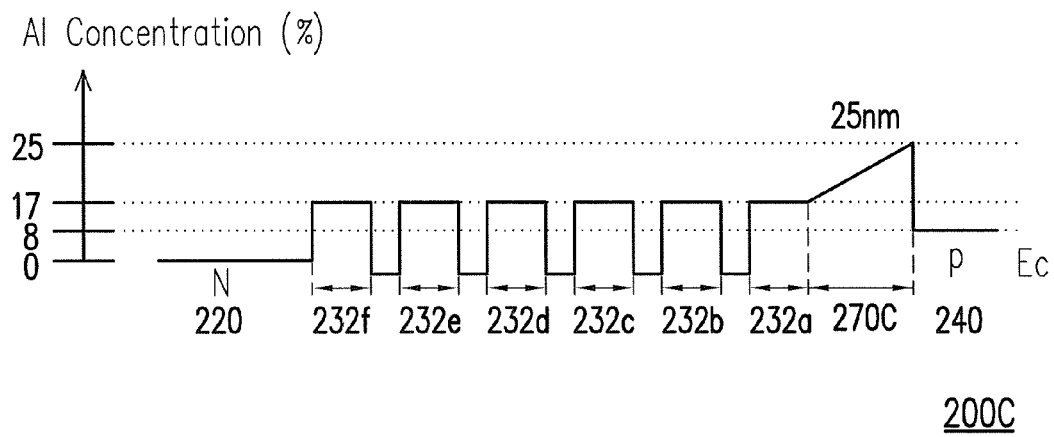
Figure 5D:
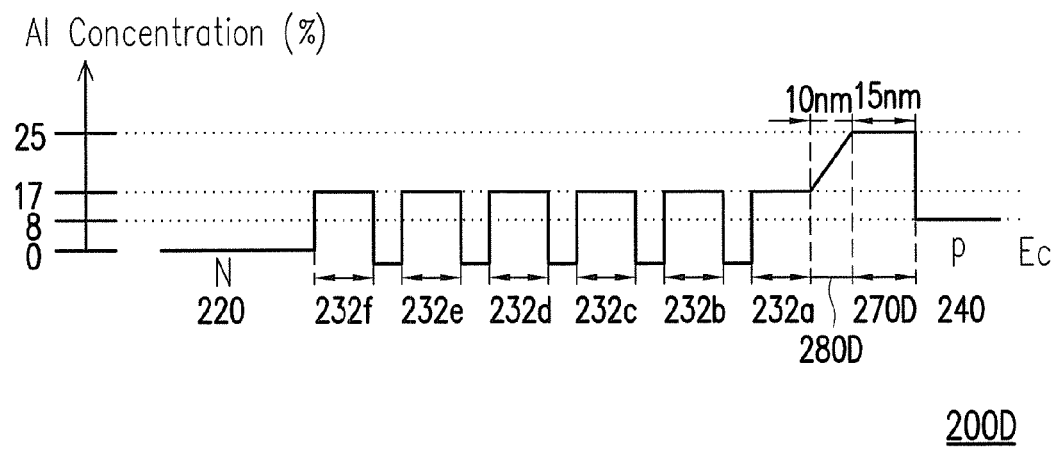

FIG. 5A to FIG. 5D respectively are schematic diagrams illustrating energy band level for several LEDs of the LEDs depicted in FIG. 4A to FIG. 4D. Same as the afore-described LEDs 200A-200C depicted in FIG. 4A to FIG. 4C, FIG. 5A to FIG. 5C are comparative examples, and FIG. 5D is the LED for the first embodiment. The horizontal axis represents the relative location (thickness) of the stacked layers in each of the LEDs 200A-200D, and the vertical axis represents the aluminium concentration of each layer. The thickness (unit: nm) of each layer is labelled above each layer. Moreover, in the first embodiment, the description is based on the interlayer 280 belonging to the graded interlayer type.

Referring to FIG. 4A and FIG. 5A, in the LED 200A, the electron barrier layer 270A is a $Al_{0.25}Ga_{0.75}N$ film having a fixed aluminium concentration of 25% and a thickness of 25 nm, while the layer structures sandwiched between the p-type semiconductor layer 240 and the active layer 230, such as the electron barrier layer 270, in the LED 200B of FIG. 4B, the LED 200C of FIG. 4C and the LED 200D of FIG. 4D, are divided into the structure having various aluminium concentrations.

More specifically, referring to FIG. 4B and FIG. 5B, in the LED 200B, after the growth of the quantum barrier layer closest to the p-type semiconductor layer 232a (as shown in FIG. 1B, FIG. 3A, and FIG. 3B), the electron barrier layer 270B1 having a fixed aluminium concentration of 25% and a thickness of 15 nm is subsequently grown, and then the electron barrier layer 270B2 having the aluminium concentration from 25% gradually reduced to 8% is grown and in contact with the p-Al0.08Ga0.92N layer (i.e., the first p-type doped GaN layer 242).

Referring to FIG. 4C and FIG. 5C, in the LED 200C, after the growth of the quantum barrier layer closest to the p-type semiconductor layer 232a, the electron barrier layer 270C having an aluminium concentration gradually increased from 17% to 25% and a thickness of 25 nm is grown. Referring to FIG. 4D and FIG. 5D, in the LED 200D of the first embodiment, after the growth of the quantum barrier layer closest to the p-type semiconductor layer 232a, the interlayer 280D having an aluminium concentration gradually increased from 17% to 25% and a thickness of 25 nm is subsequently grown, and then the electron barrier layer 270D having a fixed aluminium concentration of 25% and a thickness of 15 nm is grown.

Figure 6A:
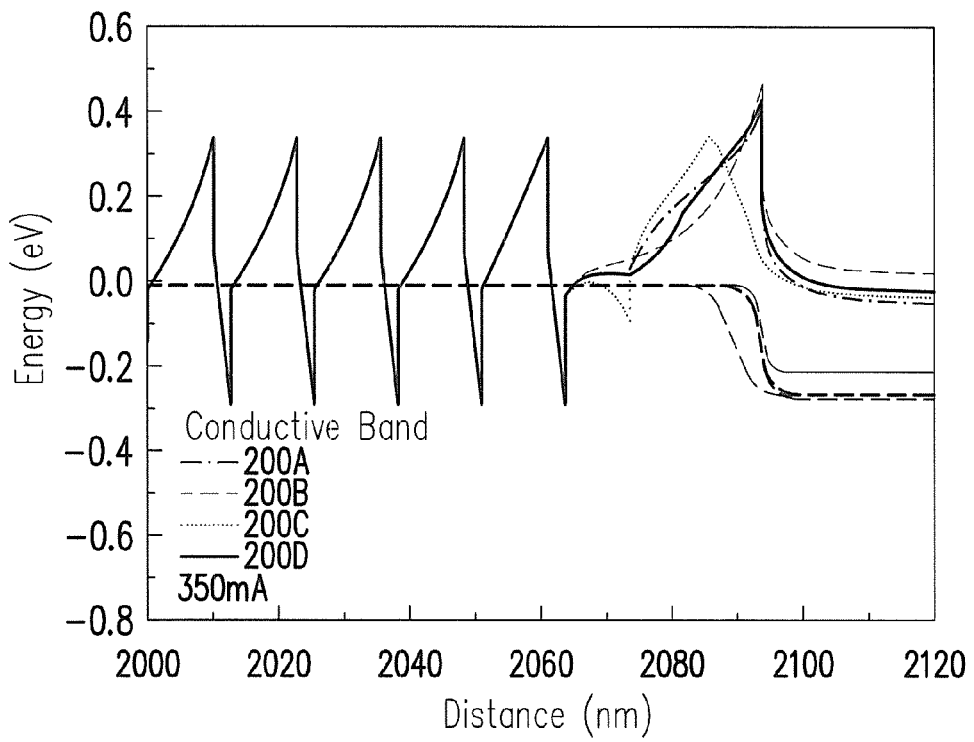
FIG. 6A and FIG. 6B respectively are simulation diagrams illustrating conductive bands and valence bands of the LEDs depicted in FIG. 4A to FIG. 4D when a current of 350 mA is applied.
Figure 6B:
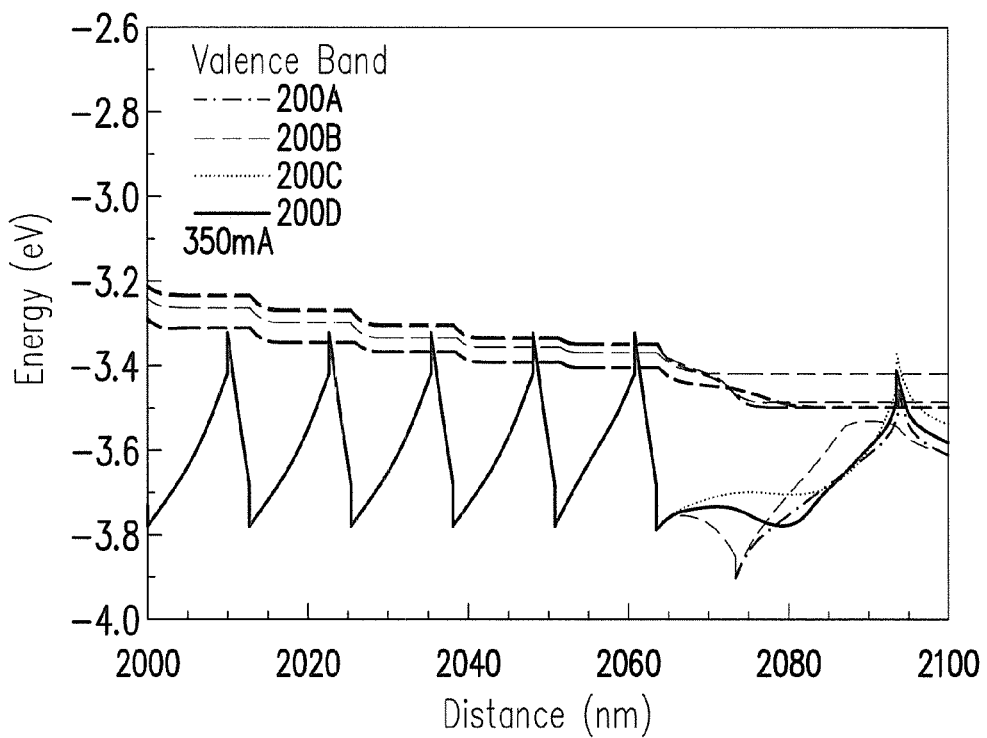
Figure 7A:
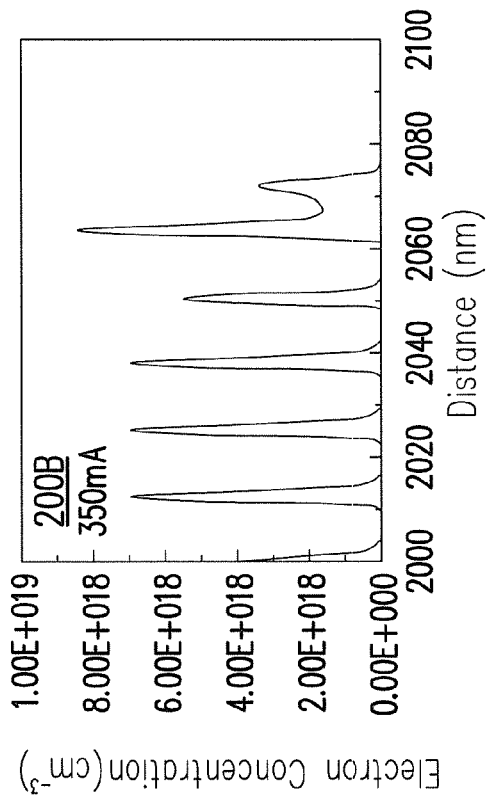
FIG. 7A to FIG. 7D respectively are simulation diagrams illustrating electron concentrations of the LEDs depicted in FIG. 4A to FIG. 4D.
Figure 7C:
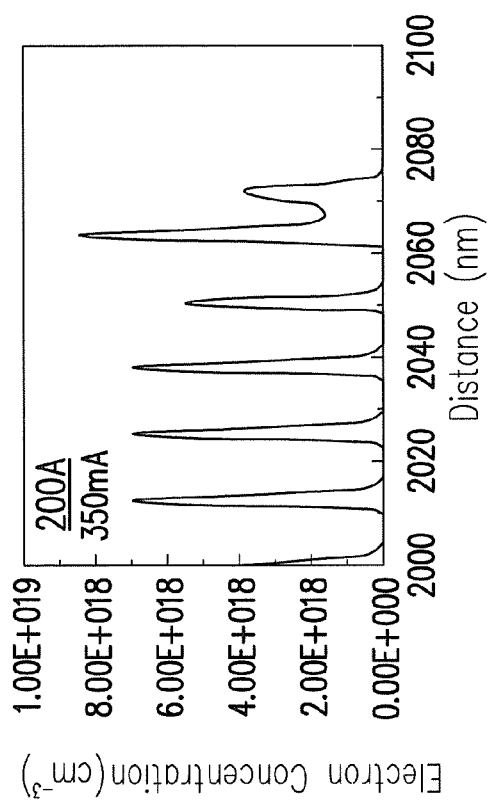
Figure 7B:
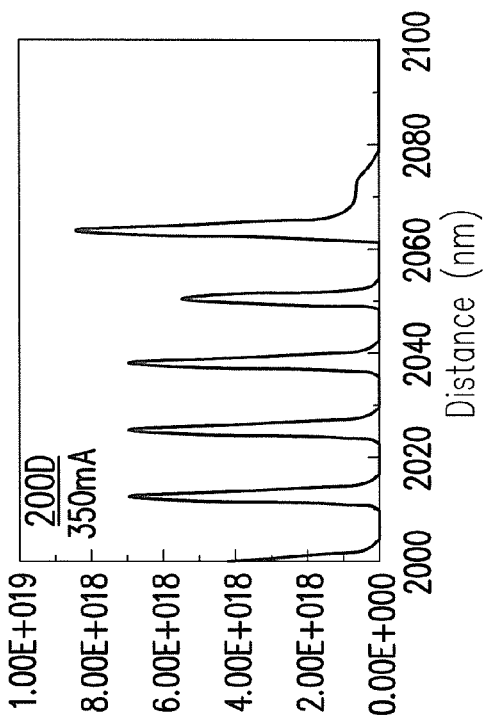
Figure 7D:
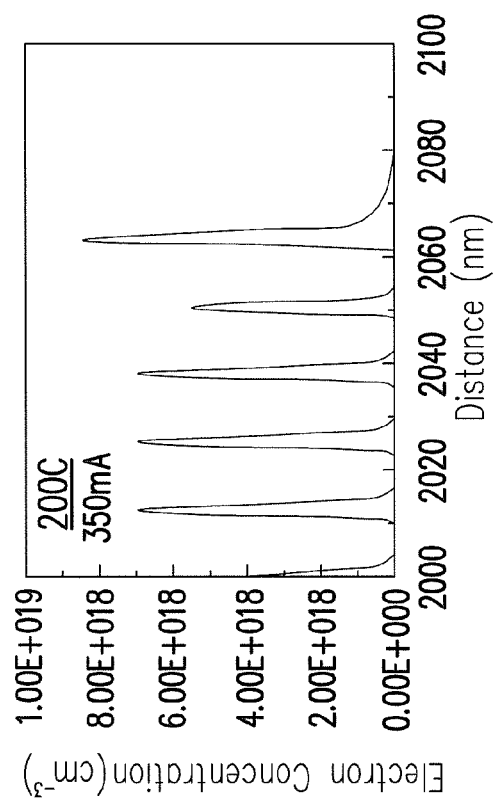
Figure 8A:
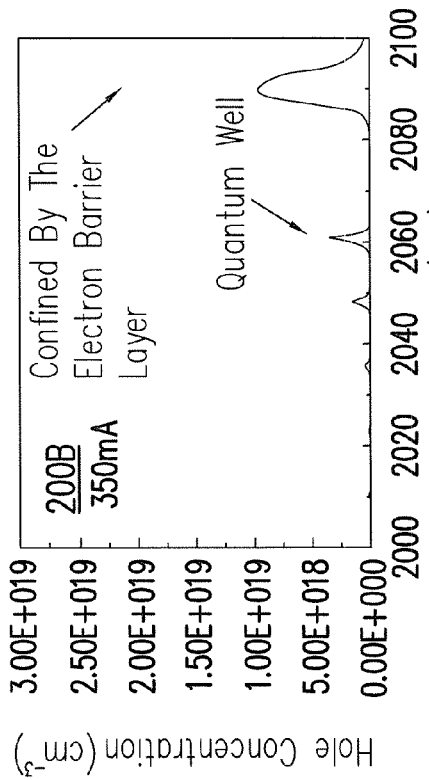
FIG. 8A to FIG. 8D respectively are simulation diagrams illustrating hole concentrations of the LEDs depicted in FIG. 4A to FIG. 4D.
Figure 8B:
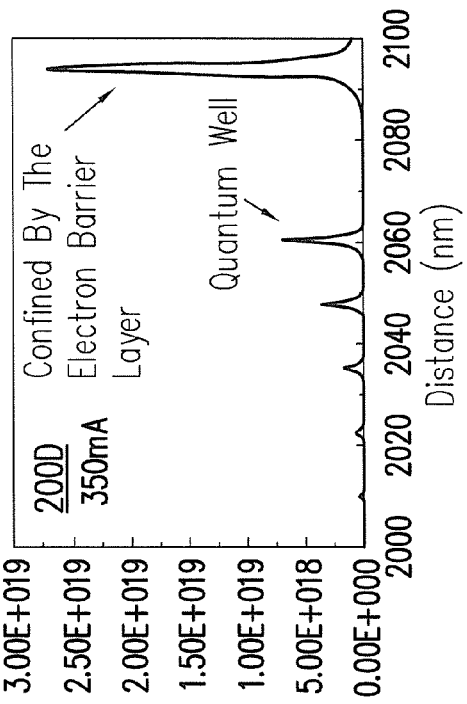
Figure 8C:
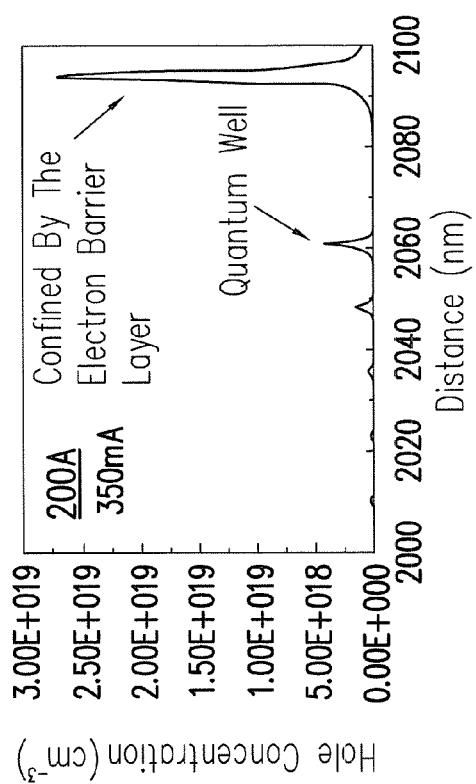
Figure 8D:
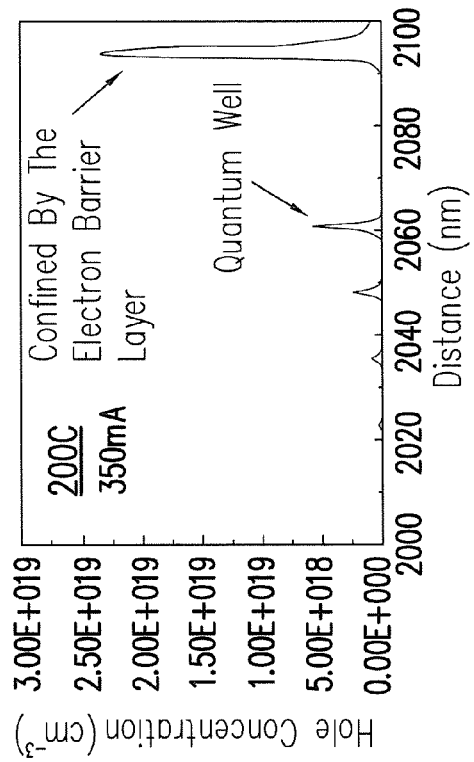
Figure 9A:
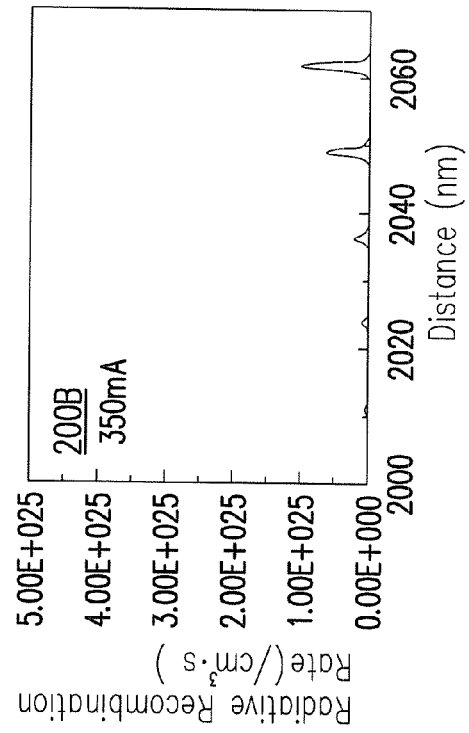
FIG. 9A to FIG. 9D respectively are simulation diagrams illustrating radiative recombination rates of the LEDs depicted in FIG. 4A to FIG. 4D.
Figure 9B:
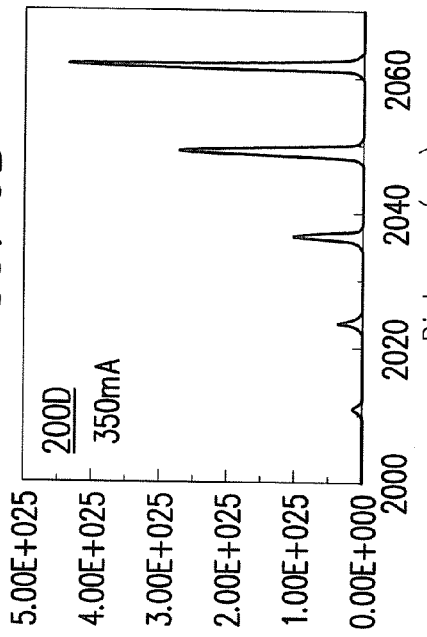
Figure 9C:
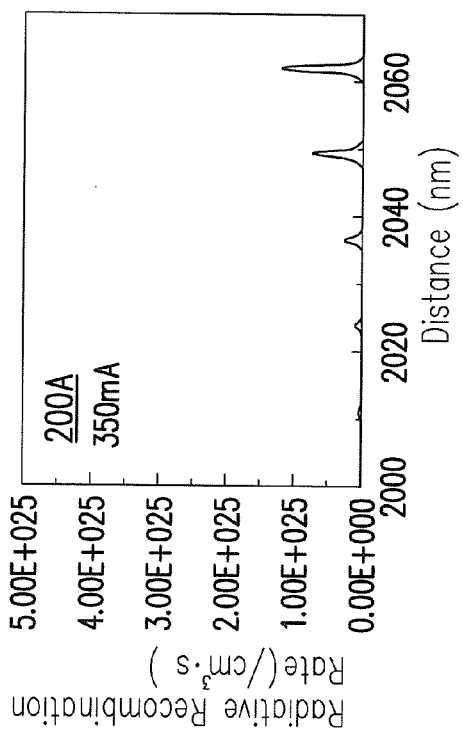
Figure 9D:
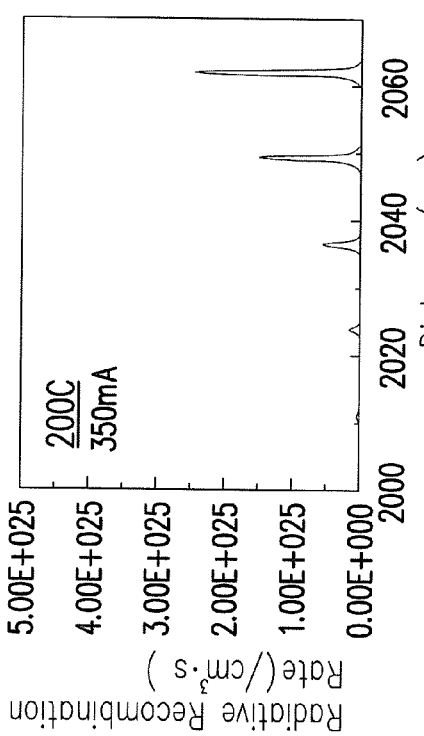

FIG. 6A and FIG. 6B respectively are simulation diagrams illustrating conductive bands and valence bands of the LEDs depicted in FIG. 4A to FIG. 4D when a current of 350 mA is applied. It can seen from FIG. 6A and FIG. 6B that, by having the interlayer 280D inserted into the structure of the LED 200D, the energy bands of the conductive band and the valence band for connecting the electron barrier layer and the quantum barrier layer closest to the p-type semiconductor layer may be varied. Specifically, as shown in FIG. 6A, the conductive band energy levels of the interlayer 280D in the LED 200D are higher than the Fermi energy level, which indicates the layer structure of the LED 200D may increase the electron confinement effects and reduce electron overflow. Additionally, as shown in FIG. 6B, the energy band discontinuity between the electron barrier layer and the quantum barrier layer closest to the p-type semiconductor layer may be removed due to the valence band of the interlayer 280D in the LED 200D, so as to facilitate the hole injection effectively.

The impact on the luminous intensity results from the layer structures having the electron barrier layer and the interlayer belonging to the graded interlayer type in the LEDs 200A-200C, which is further explained below.

FIG. 7A to FIG. 7D respectively are simulation diagrams illustrating electron concentrations of the LEDs depicted in FIG. 4A to FIG. 4D. FIG. 8A to FIG. 8D respectively are simulation diagrams illustrating hole concentrations of the LEDs depicted in FIG. 4A to FIG. 4D.

The horizontal axis represents the distance (unit: nm) from the stacked layers to the substrate, for instance, a distance of 2060 nm is a location of the quantum barrier layer 232a close to the p-type semiconductor layer 240, and a distance of 2000 nm is close to the n-type semiconductor layer 220. The vertical axis represents electron concentration or hole concentration (unit: $cm^{-3}$). From FIG. 7A to FIG. 7D, the structures having the electron barrier layer 270D and the interlayer 280D in the LED 200D may facilitate the electron confinement effects, such that the overall electron concentration is raised higher. Additionally, from FIG. 8A to FIG. 8D, the structures having the electron barrier layer 270D and the interlayer 280D in the LED 200D may also facilitate the hole injection. Particularly, the electron and hole concentrations of the LED 200D are higher than that of the LED 200C.

FIG. 9A to FIG. 9D respectively are simulation diagrams illustrating radiative recombination rates of the LEDs depicted in FIG. 4A to FIG. 4D. From FIG. 9A to FIG. 9D, the LED 200D of the first embodiment has the highest recombination rate.

The probability of wave-function overlap in quantum well 234 of the LEDs 200A-200D in the present embodiment, is simulated and shown in Table 1. Referring to Table 1 and FIG. 9A to FIG. 9D together, three quantum wells 234a-234c (as shown in FIG. 3A and FIG. 3B) close to the p-type semiconductor layer 240 in the LED 200D have higher recombination rates.

TABLE 1

| LED | Quantum well 234e | Quantum well 234d | Quantum well 234c | Quantum well 234b | Quantum well 234a |
|-----|-------|-------|-------|-------|-------|
| 200A | 16.62 | 16.58 | 16.75 | 18.4  | 12.96 |
| 200B | 16.62 | 16.57 | 16.72 | 18.34 | 12.79 |
| 200C | 16.65 | 16.67 | 16.98 | 18.86 | 14.15 |
| 200D | 16.70 | 16.82 | 17.29 | 19.39 | 15.23 |

Figure 10:
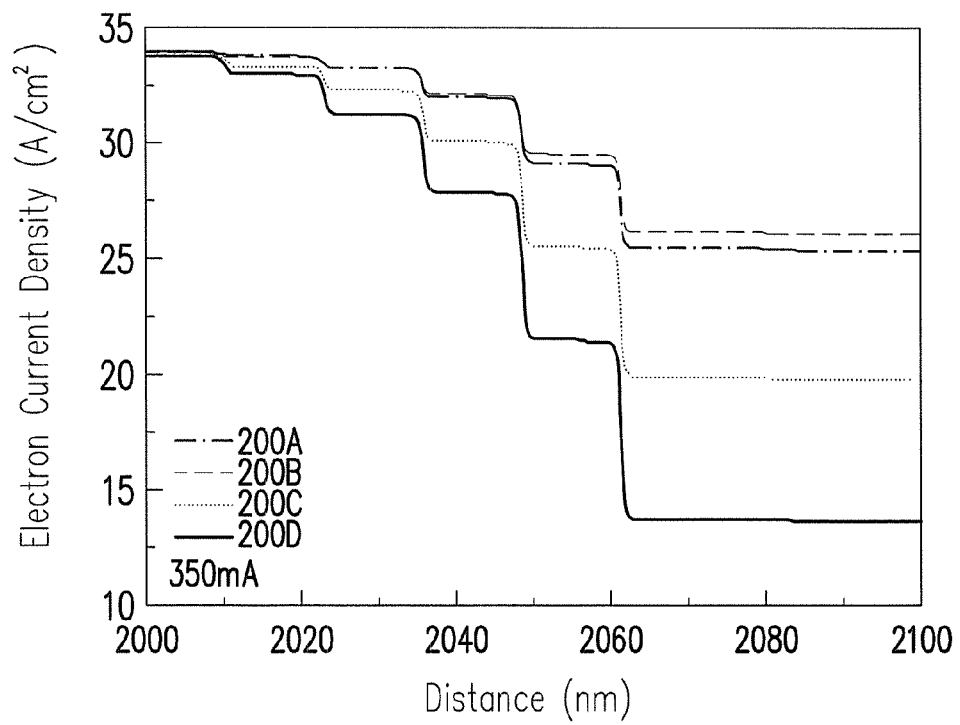
FIG. 10 is a simulation diagram illustrating electron current density of the LEDs depicted in FIG. 4A to FIG. 4D.

Further, FIG. 10 is a simulation diagram illustrating electron current density of the LEDs depicted in FIG. 4A to FIG. 4D. From FIG. 10, the layer structures having the electron barrier layer 270D and the interlayer 280D in the LED 200D may facilitate to reduce electron overflow, in particular, the phenomenon of electron overflow occurs less in the LED 200D.

Figure 11:
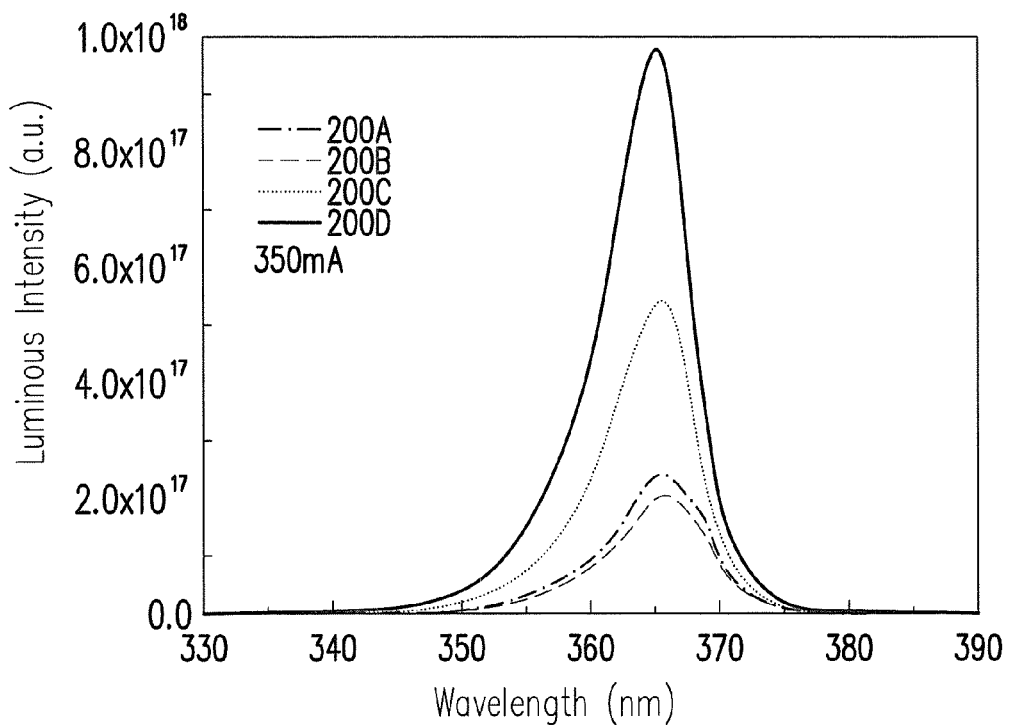
FIG. 11 is a simulation diagram illustrating luminous intensity of the LEDs depicted in FIG. 4A to FIG. 4D.

Further, FIG. 11 is a simulation diagram illustrating luminous intensity of the LEDs depicted in FIG. 4A to FIG. 4D. From FIG. 11, the LED 200D in the first embodiment has the highest luminous intensity.

It can inferred from the results presented in FIGS. 4A-4D to FIG. 11 that, by inserting the interlayer between the electron barrier layer and the quantum barrier layer closest to the p-type semiconductor layer in the active layer, and changing the aluminium concentration in the interlayer, the lattice constant of the interlayer may be varied. In other words, with the graded interlayer being the implantation of the interlayer, the impact on the luminous intensity resulting from the difference in lattice constants of the interlayer in the LEDs may be inferred as follow.

The lattice constant of the interlayer may be modulated by changing the aluminium concentration of the interlayer material. In other words, in the present embodiment, when the aluminium concentration in the interlayer material is higher, the lattice constant of the interlayer is smaller. From the conventional lattice constant formula, the lattice constant of $Al_aIn_bGa_{1-a-b}N$ may be calculated as $3.112 \times a + 3.544 \times b + 3.1892 \times (1-a-b)$. In the case of b=0, when the aluminium concentration a is equal to 0.08, the corresponding lattice constant is 3.1830 Å; when the aluminium concentration a is equal to 0.17, the corresponding lattice constant is 3.1761 Å; and when the aluminium concentration, a, is equal to 0.25, the corresponding lattice constant is 3.1699 Å.

In other words, in the present embodiment, by grading the aluminium concentration in the interlayer material, from the aluminium concentration of the quantum barrier layer closest to the p-type semiconductor layer in the active layer to the aluminium concentration of the electron barrier layer, the lattice constant of the interlayer may be different from the lattice constants of the electron barrier layer and the quantum barrier layer. Therefore, upon the results presented in FIGS. 4A-4D to FIG. 11, since the lattice constant of the interlayer is different from the lattice constants of the adjacent quantum barrier layer and the electron barrier layer, the energy bands of the conductive band and the valence band for connecting the electron barrier layer and the quantum barrier layer closest to the p-type semiconductor layer in the active layer may be varied. Thus, the conductive band energy level is higher than the Fermi energy level, thereby improving the electron confinement effects and reducing electron overflow. Moreover, by removing the energy band discontinuity between the electron barrier layer and the quantum barrier layer closest to the p-type semiconductor layer in the valence band, the hole injection may be facilitated effectively and the hole injection efficiency may be improved, thereby enhancing the luminous efficiency of the LED drastically.

Similarly, by having the thickness $t_2$ of the interlayer and the thickness $t_3$ of the electron barrier layer to satisfy the specific relationship, i.e., $t_2 \leq 0.9 t_3$, and under the condition that the thickness $t_3$ is thick enough, electrons may be prevented to tunnel through the electron barrier layer, from the quantum barrier layer closest to the p-type semiconductor layer to the p-type semiconductor layer. Thus, the electron confinement effects are improved, thereby enhancing the afore-described effects.

The aforementioned inferences are further illustrated with support from the experimental results described below. Table 2 records the luminous intensity and the forward turn-on voltage that result under different currents (i.e., the currents of 350 mA and 700 mA are applied) of the LEDs 200A, 200B and 200D, when the structures between the electron barrier layer and the quantum barrier layer closest to the p-type semiconductor layer in the active layer are varied in the LEDs 200A, 200B and 200D as shown in FIG. 4A, FIG. 4B and FIG. 4D. Herein, in the present embodiment, the active layer 230 includes five quantum wells 234, and the thickness of each of the quantum wells 234a-234e is 3 nm.

In other words, when the variation rate, m, obtained from the changes of the lattice constant $a_2$ and the thickness $t_2$ of the interlayer 280D, satisfies the relationship, i.e., $m \geq 9 \times 10^{-4}$

TABLE 2

| LED | Interlayer 280 | | Electron Barrier Layer 270 | | Luminous Intensity at 350 mA (mW) | Luminous Intensity at 700 mA (mW) | Forward Turn-on Voltage at 350 mA (V) |
|---|---|---|---|---|---|---|---|
| | Thickness $t_2$ (nm) | Aluminium Concentration (%) | Thickness $t_3$ (nm) | Aluminium Concentration (%) | | | |
| 200A | — | — | 25 | — | 33.1 | 61.6 | 4.28 |
| 200B | — | — | 15 | 25% | 24.5 | 43.3 | 4.13 |
| | | | 10 | 25% to 8% | | | |
| 200D | 10 | 17% to 25% | 15 | 25% | 54.0 | 91.8 | 4.17 |

As shown in Table 2 and FIG. 4A, the LED 200A has the luminous intensity of 33.1 mW when the LED 200A having the electron barrier layer 270A (i.e., a layer with a fixed aluminium concentration) is applied. By contrast, as shown in Table 2 and FIG. 4D, when the structure is changed to the LED 200D having the electron barrier layer 270D and the interlayer 280D, the luminous intensity may be increased drastically, from the original 33.1 mW to 54.0 mW. Additionally, from Table 2 and FIG. 4D, the structure of the LED 200D may facilitate to reduce the energy band discontinuity effects between the electron barrier layer 270D and the quantum barrier layer closest to the p-type semiconductor layer 232a, and to improve the hole injection and reduce the resistance between the interfaces, so as to facilitate reducing the forward turn-on voltage, from the original 4.28V to 4.17V.

Moreover, referring to Table 2 and FIG. 4D, in the LED 200D, the thickness $t_2$ of the interlayer 280D is 10 nm and the thickness $t_3$ of the electron barrier layer 270D is 15 nm. In other words, the thickness $t_2$ of the interlayer and the thickness $t_3$ of the electron barrier layer satisfy the specific relationship, i.e., $t_2$ (10 nm)$\leq 0.9 t_3$ (15 nm$\times 0.9$=13.5 nm), which may also achieve the afore-described effects. In other words, by having the thickness $t_2$ of the interlayer and the thickness $t_3$ of the electron barrier layer to satisfy the specific relationship, i.e., $t_2 \leq 0.9 t_3$, electrons may be prevented to tunnel through the electron barrier layer, from the quantum barrier layer closest to the p-type semiconductor layer to the p-type semiconductor layer. Thus, the electron confinement effects are improved, thereby enhancing the afore-described effects.

To be more specific, as shown in FIG. 4D, the variation rate obtained from the changes of the lattice constant $a_2$ and the thickness $t_2$ of the interlayer 280D, satisfies the following relationships. Namely, since the change of the lattice constant $a_2$ of the interlayer 280D may be treated as the change of the aluminium concentration of the interlayer 280D, for instance, an aluminium concentration changed from x % to y % may correspond to the lattice constant changed from $a_x$ Å to $a_y$ Å. Therefore, the variation rate, m, obtained from the changes of the lattice constant $a_2$ and the thickness $t_2$ of the interlayer 280D may be calculated by the following formula (1):

$$m = \frac{\left(\left|\frac{a_y - a_x}{a_x}\right| \times 100\%\right)}{t_2} \quad (1)$$

(%/Å), the effects such as improving the electron confinement effects, reducing electron overflow, increasing the hole injection and enhancing the luminous intensity may be achieved. In the present embodiment, when the aluminium concentration is 17%, the corresponding lattice constant is 3.1761 Å, and when the aluminium concentration, a, is equal to 0.25, the corresponding lattice constant is 3.1699 Å, and thus in the case of the thickness $t_2$=10 nm (100 Å), where:

$$m = \frac{\left(\left|\frac{3.1699 - 3.1761}{3.1761}\right| \times 100\%\right)}{100} = 1.95 \times 10^{-3} \ (\%/\text{Å}).$$

Figure 12:
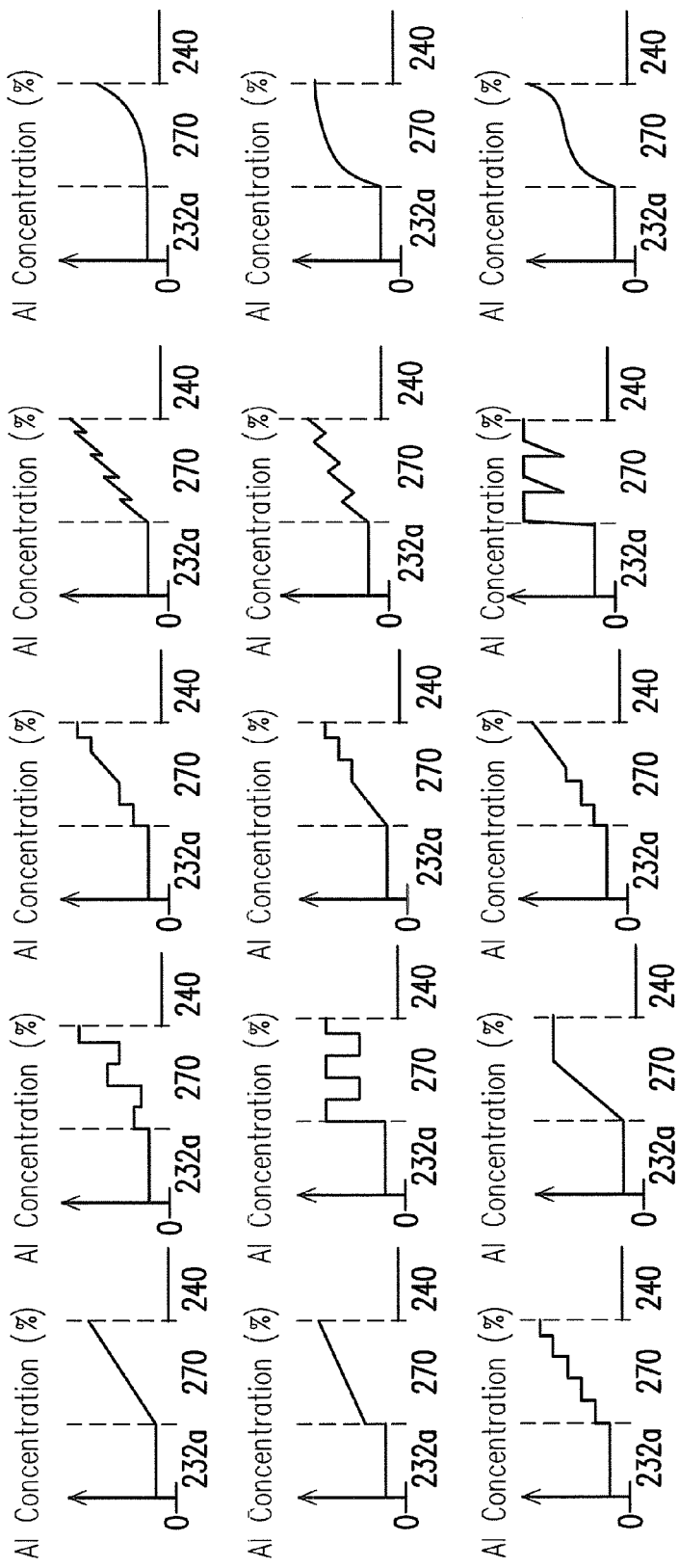
FIG. 12 illustrates variations of an aluminium concentration between a p-type semiconductor layer and a quantum barrier layer closest to the p-type semiconductor layer in an active layer of an LED.

Similarly, upon the experimental data presented above, after the growth of the quantum barrier layer closest to the p-type semiconductor layer, gradually increasing the aluminium concentration to the aluminium concentration of the electron barrier layer may facilitate to enhance the luminous intensity. Therefore, in the afore-described LEDs, the variations for the aluminium concentration between the p-type semiconductor layer and the quantum barrier layer closest to the p-type semiconductor layer in the active layer, are illustrated in FIG. 12. In other words, the variation of the aluminium concentration may be, for instance, a linear variation, a step variation, a zigzag variation or a parabolic variation, wherein the variations may be cooperated with each other, although the disclosure is not limited thereto. According to the afore-described implementations in the disclosure, people skilled in the art may apply experiments to change the variation of the aluminium concentration between the p-type semiconductor layer and the quantum barrier layer closest to the p-type semiconductor layer in the active layer of the LED, by the means illustrated in FIG. 12, which may also achieve the similar effects as described in the disclosure. Furthermore, the means for varying the aluminium concentration between the p-type semiconductor layer and the quantum barrier layer closest to the p-type semiconductor layer, are not limited in the disclosure.

In view of the foregoing, in the first embodiment of the disclosure, by inserting the interlayer (that having a lattice constant is different from that of the quantum barrier layer and the electron barrier layer) between the electron barrier layer and the quantum barrier layer closest to the p-type semiconductor layer in the active layer, namely, by having the aluminium concentration closest to the p-type semiconductor layer substantially greater than the aluminium concentration closest to the n-type semiconductor layer, the electron confinement effects may be improved effectively, the electron overflow activity may be reduced, and both the hole injection efficiency and the luminous intensity may be enhanced.

Additionally, as indicated in Table 2, in the first embodiment of the disclosure, by having the thickness $t_2$ of the interlayer and the thickness $t_3$ of the electron barrier layer to satisfy the specific relationship of $t_2 \leq 0.9 t_3$, in particular, having the variation rate obtained from the changes of the lattice constant and the thickness of the interlayer (as shown in FIG. 4D) greater than or equal to $9 \times 10^{-4}$ (%/Å), the electron confinement effects may also be improved effectively, the electron overflow activity may be reduced, and both the hole injection efficiency and the luminous intensity may be enhanced.

Second Embodiment

FIG. 13A to FIG. 13D respectively are schematic diagrams illustrating structures of the LEDs according to a second embodiment. The details of layer structure in the LEDs 200A and 200E-200G depicted in FIG. 13A to FIG. 13D are clearly illustrated in the structures depicted in FIG. 1A and FIG. 1B except that the elements of the interlayers and the structures of the electron barrier layers depicted in FIG. 13A to FIG. 13D are changed. In other words, in the second embodiment of the disclosure, the interlayer is the implementation of the polarization field reversal interlayer, with the rest of the layers being the same as described above, and so further elaboration is omitted.

Figure 13A:
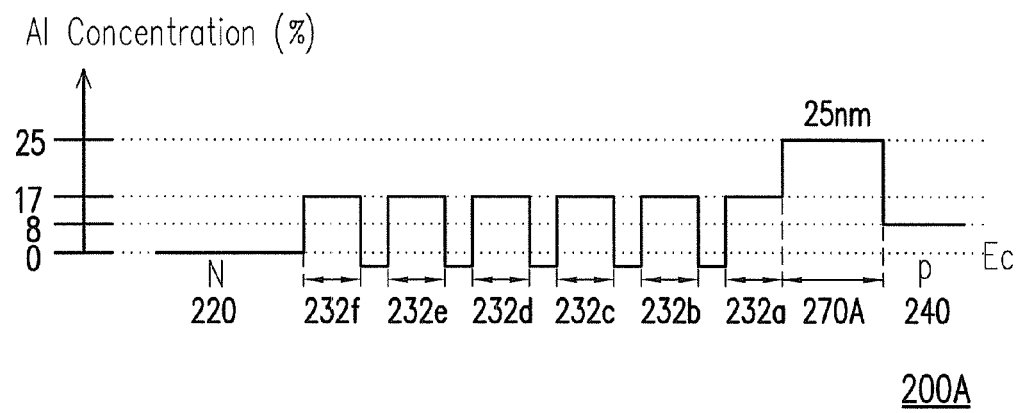
FIG. 13A to FIG. 13D respectively are schematic diagrams illustrating structure pattern of the LEDs according to a second embodiment.
Figure 13B:
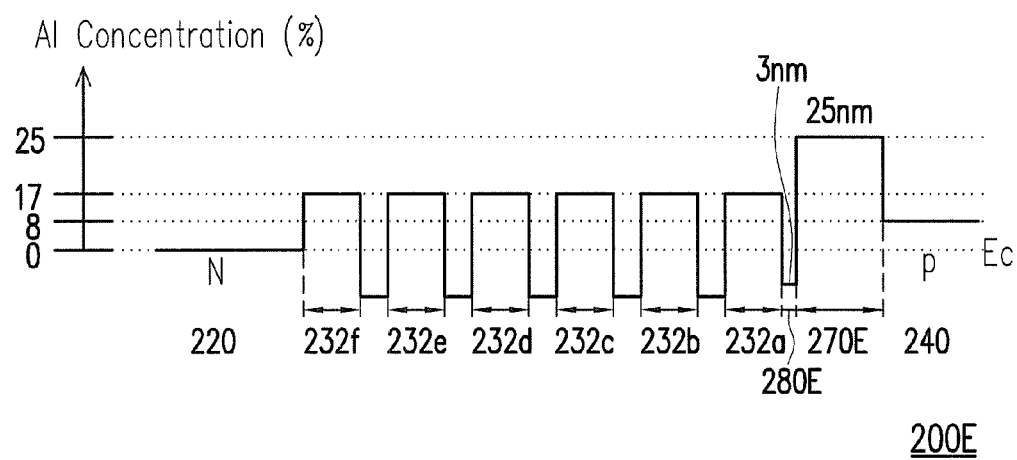
Figure 13C:
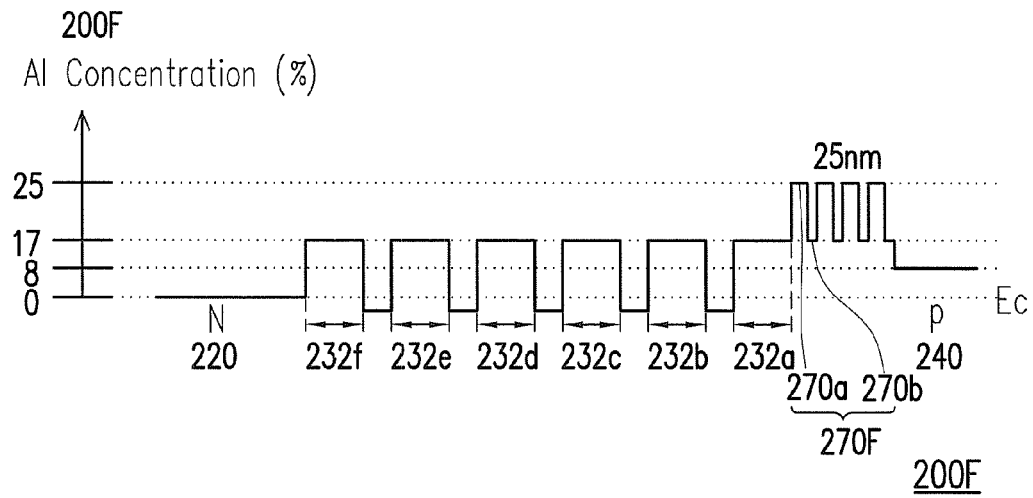
Figure 13D:
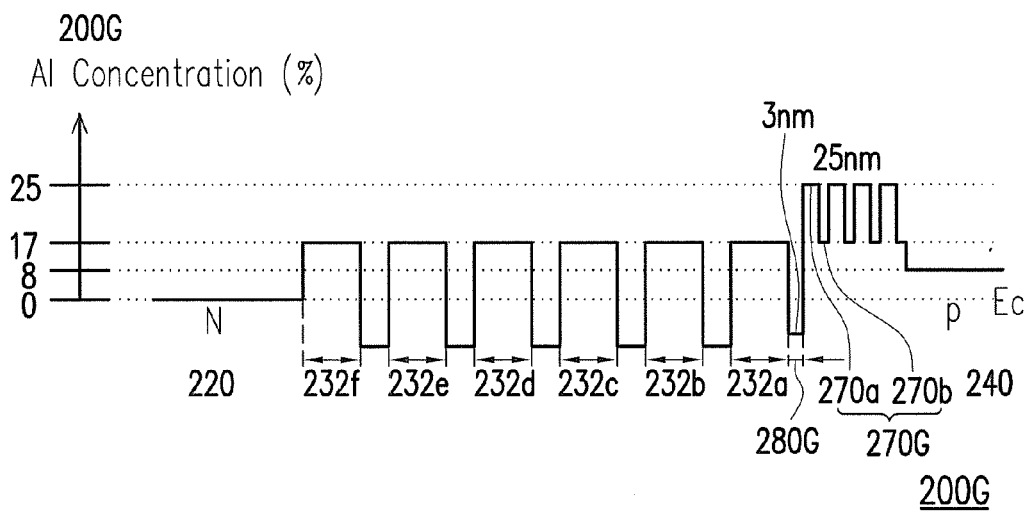

Specifically, FIG. 13A to FIG. 13D respectively are structural diagrams illustrating design of several LEDs 200A and 200E-200G. FIG. 13B and FIG. 13D are the LEDs for the second embodiment of the disclosure, respectively. FIG. 13A and FIG. 13C serve as the comparative examples for the LEDs of the second embodiment, respectively. In FIG. 13A to FIG. 13D, the horizontal axis represents the relative location (thickness) of the stacked layers in each of the LEDs, and the vertical axis represents the aluminium concentration of each layer. The thickness (unit: nm) of each layer is labelled above each layer. Moreover, the LED 200A in the present embodiment is identical to the LED 200A in the previous embodiment depicted in FIG. 4A to FIG. 5A.

Referring to FIG. 13B, in the LED 200E, a gallium nitride (GaN) epitaxial layer having a thickness of 3 nm is inserted between the electron barrier layer 270E and the quantum barrier layer closest to the p-type semiconductor layer 232a, in order to serve as the interlayer 280E. At this time, the interlayer 280E belongs to the polarization field reversal interlayer type, and the electron barrier layer 270E is the same as that illustrated in FIG. 13A. Referring to FIG. 13C and FIG. 13D, the electron barrier layers 270F and 270G are designed apart into four loops (namely, four repeating units) in the LEDs 200F and 200G. In other words, the electron barrier layers 270F and 270G respectively includes four stacked layers in which one first sub electron barrier layers 270a and one second sub electron barrier layers 270b is as a repeating unit, in which the first sub electron barrier layer 270a is located adjacent to a side of the active layer 230, and the aluminium concentration of the first sub electron barrier layers 270a is different from the aluminium concentration of the second sub electron barrier layers 270b. As shown in FIG. 13C, the first and the second sub electron barrier layers 270a and 270b of the LED 200F comprises $Al_{0.25}Ga_{0.75}N$ and $Al_{0.17}Ga_{0.83}N$ respectively. As shown in FIG. 13C, the aluminium concentration of the first sub electron barrier layer 270a is greater than that of the second sub electron barrier layer 270b. Certainly, in other embodiments, the aluminium concentration of the first sub electron barrier layer 270a may also be smaller than that of the second sub electron barrier layer 270b, although the disclosure is not limited thereto.

Moreover, referring to FIG. 13D, based on the layer structure of the LED 200F depicted in FIG. 13C, in the LED 200G, a GaN epitaxial layer having a thickness of 3 nm is inserted between the electron barrier layer 270G and the quantum barrier layer closest to the p-type semiconductor layer 232a, in order to serve as the interlayer 280G. The first sub electron barrier layer 270a is in contact with the interlayer 280G. At this time, the interlayer 280G belongs to the polarization field reversal interlayer type.

Figure 14:
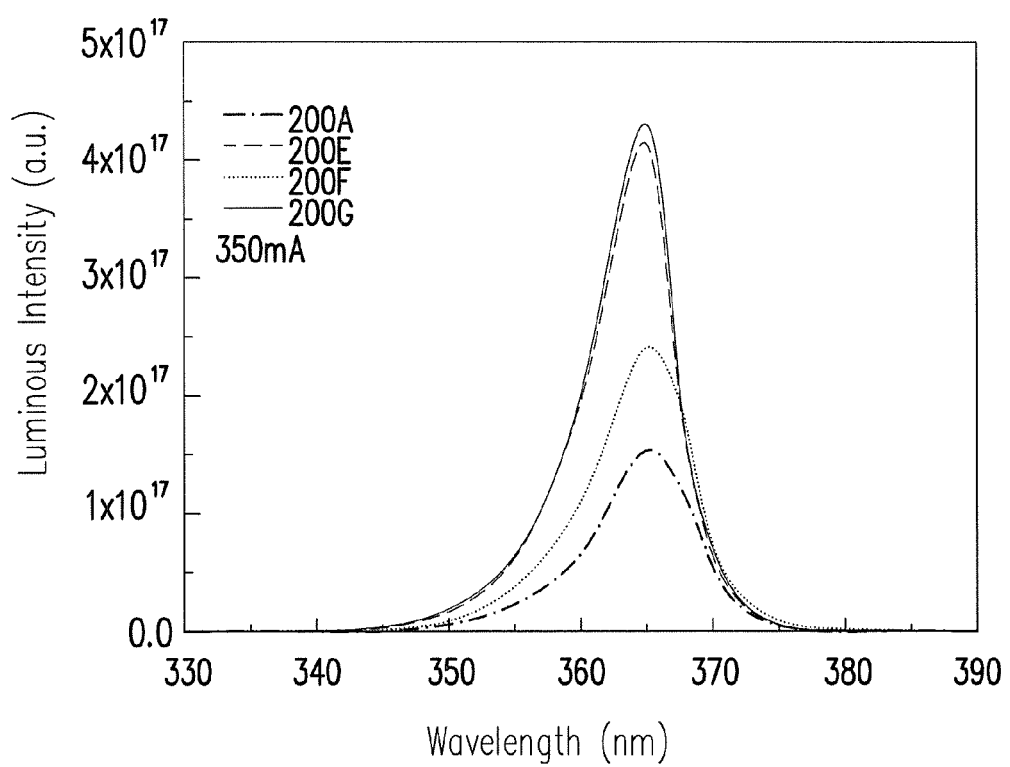
FIG. 14 is a simulation diagram illustrating luminous intensity of the LEDs depicted in FIG. 13A to FIG. 13D.

FIG. 14 is a simulation diagram illustrating luminous intensity of the LEDs depicted in FIG. 13A to FIG. 13D. From FIG. 14, when the electron barrier layer comprises four loops (four repeating units of stacked layers) derived from $Al_{0.25}Ga_{0.75}N$ (i.e., serves as the first sub electron barrier layers 270a) and $Al_{0.17}Ga_{0.83}N$ (i.e., serves as the second sub electron barrier layers 270b), the luminous intensity thereof is higher than that of the electron barrier layer having the fixed aluminium concentration. For instance, the luminous intensity of the LED 200G depicted in FIG. 13D is greater than the luminous intensity of the LED 200E depicted in FIG. 13B, and the luminous intensity of the LED 200F depicted in FIG. 13C is greater than the luminous intensity of the LED 200A depicted in FIG. 13A.

Moreover, referring to FIG. 14, when a GaN epitaxial layer served as the interlayer 280E/280G is inserted between the electron barrier layer 270E/270G and the quantum barrier layer closest to the p-type semiconductor layer 232a, the luminous intensity can be enhanced drastically, even with the electron barrier layer having the fixed aluminium concentration in the LED 200A, for instance.

Referring to FIG. 14, FIG. 13A and FIG. 13B, the luminous intensity of the LED 200E having the interlayer 280E inserted between the electron barrier layer 270E (i.e., a layer with a fixed aluminium concentration) and the quantum barrier layer closest to the p-type semiconductor layer 232a, is greater than that of the LED 200A depicted in FIG. 13A without having the interlayer inserted at the afore-described location. Moreover, referring to FIG. 14, FIG. 13C and FIG. 13D, the luminous intensity of the LED 200G having the interlayer 280G inserted between the electron barrier layer 270G (i.e., comprising four loops with the variable aluminium concentration) and the quantum barrier layer closest to the p-type semiconductor layer 232a, is greater than that of the LED 200F depicted in FIG. 13C without having the interlayer inserted at the afore-described location.

Figure 15A:
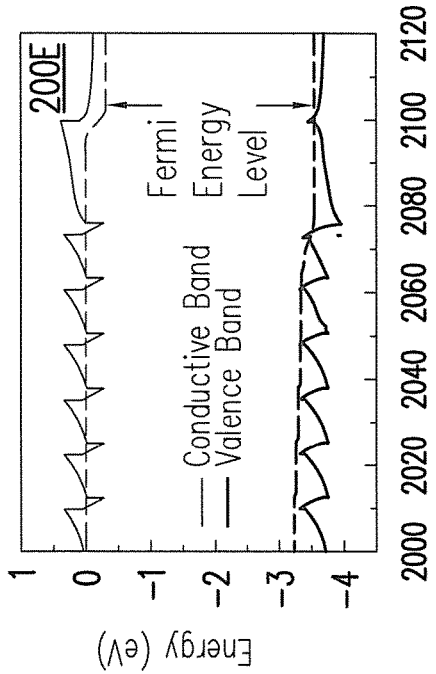
FIG. 15A to FIG. 15D respectively are simulation diagrams illustrating conductive bands and valence bands of the LEDs depicted in FIG. 13A to FIG. 13D when a current of 350 mA is applied.
Figure 15B:
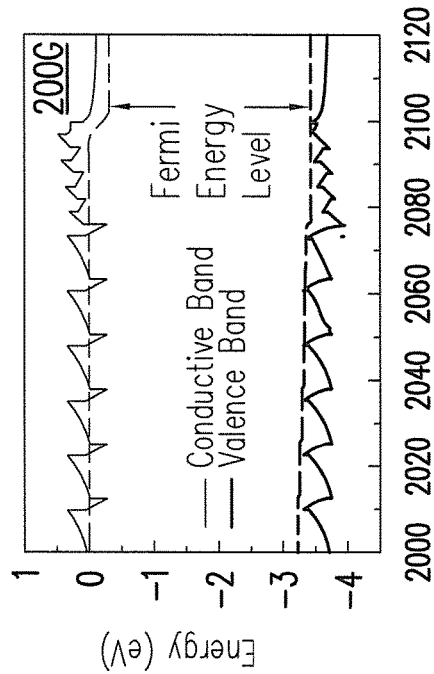
Figure 15C:
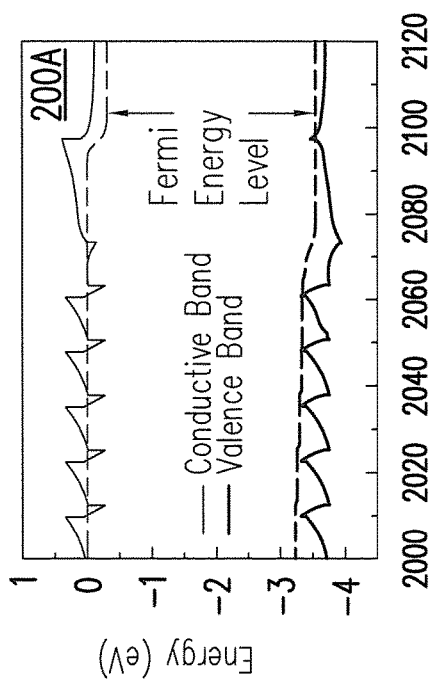
Figure 15D:
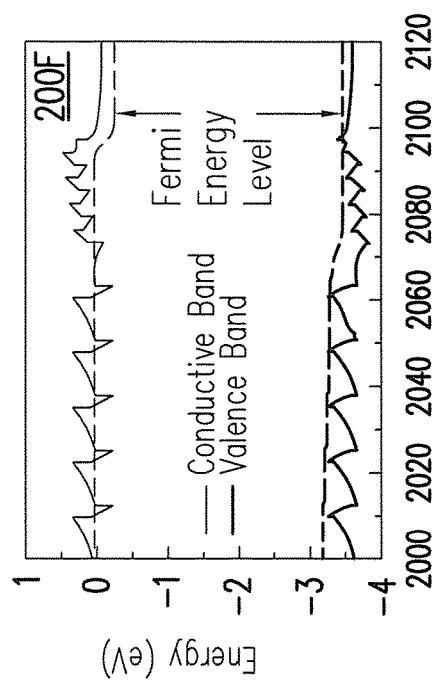

FIG. 15A to FIG. 15D respectively are simulation diagrams illustrating conductive bands and valence bands of the LEDs depicted in FIG. 13A to FIG. 13D when a current of 350 mA is applied. As shown in FIG. 15A and FIG. 15C, when the electron barrier layer comprises the four loops derived from alternating $Al_{0.25}Ga_{0.75}N$ for being the first sub electron barrier layers 270a with $Al_{0.17}Ga_{0.83}N$ for being the second sub electron barrier layers 270b, the energy band discontinuity between the electron barrier layer 270A and the p-type semiconductor layer 240 may be removed. Thus, holes being blocked between the electron barrier layer 270A and the p-type semiconductor layer 240 may be reduced, thereby improving the hole injection efficiency.

Additionally, as to the ultraviolet LED, the electron barrier layer and the quantum barrier layer thereof are usually used AlGaN, wherein the aluminium concentration of the electron barrier layer is greater than that of the quantum barrier layer. Therefore, in the present embodiment, by inserting the GaN epitaxial layer between the electron barrier layer and the quantum barrier layer closest to the p-type semiconductor layer to serve as the polarization field reversal interlayer, the polarization field direction of the polarization field reversal interlayer and the quantum barrier layer is different from the polarization field direction of the quantum barrier layer and the electron barrier layer. In other words, since the polarization field direction of GaN and AlGaN is different form the polarization field direction of AlGaN and AlGaN, the conductive band energy level may be effectively increased to be higher than the Fermi energy level and the potential barrier for holes injection may be reduced, thereby improving the hole injection efficiency.

The impact on the luminous intensity results from the layer structures having the electron barrier layer and the interlayer (that belongs to the polarization field reversal interlayer type) in the LEDs 200A and 200E-200G, which is further explained below.

FIG. 16A to FIG. 16D respectively are simulation diagrams illustrating carriers of the LEDs depicted in FIG. 13A to FIG. 13D. The horizontal axis represents the distance (unit: nm) from the stacked layers to the substrate, for instance, a distance of 2100 nm is close to the p-type semiconductor layer 240, and a distance of 2000 is close to the n-type semiconductor layer 220. The vertical axis represents carrier concentration (unit: cm$^{-3}$), and the dash line and the solid line denote electron concentration and hole concentration (unit: cm$^{-3}$), respectively. As shown in FIG. 16, when the electron barrier layer comprising the four loops (such as, the LED 200F depicted in FIG. 16C and the LED 200G depicted in FIG. 16D) is applied, holes being blocked between the electron barrier layer 270F/270G and the p-type semiconductor layer 240 may be effectively reduced, so as to increase the hole concentration distributed in the active layer.

Figure 16A:
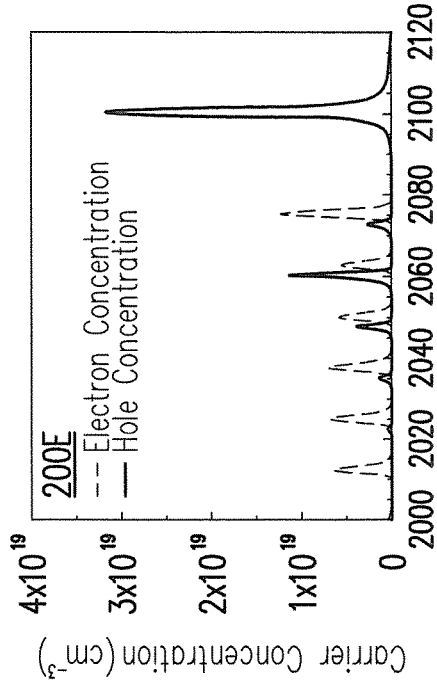
FIG. 16A to FIG. 16D respectively are simulation diagrams illustrating carriers of the LEDs depicted in FIG. 13A to FIG. 13D.
Figure 16B:
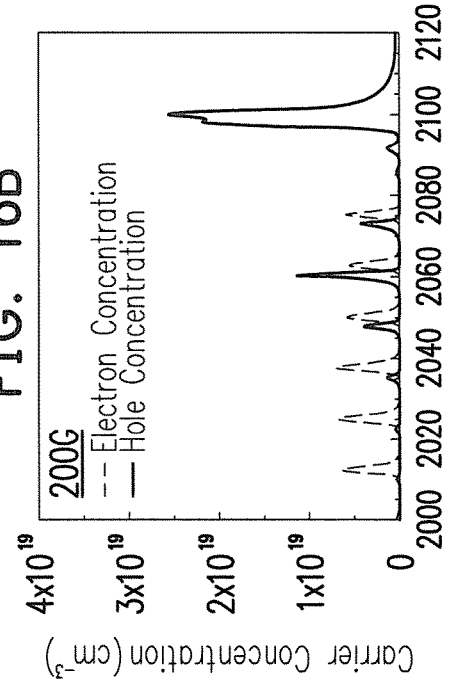
Figure 16C:
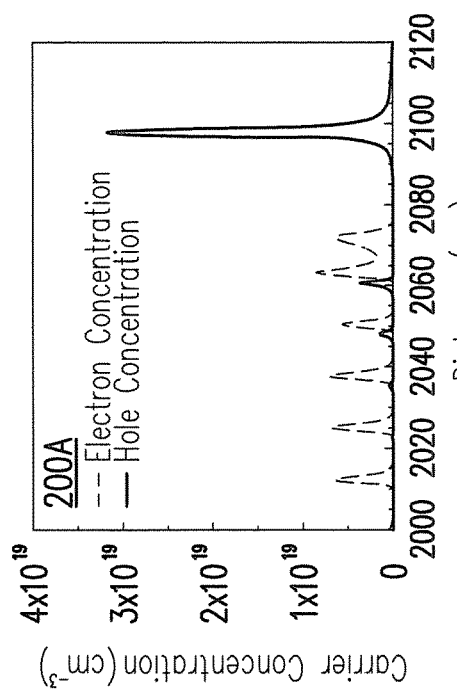
Figure 16D:
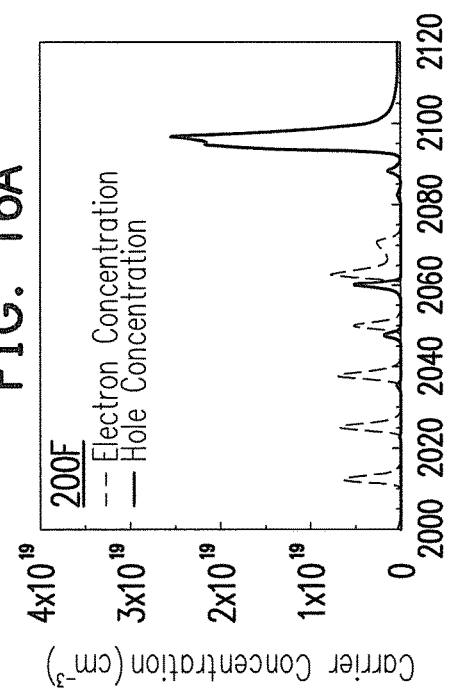
Figure 17B:
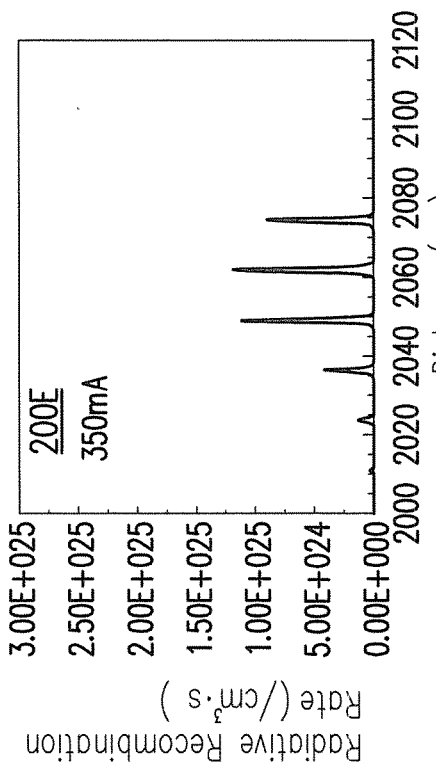
FIG. 17A to FIG. 17D respectively are simulation diagrams illustrating radiative recombination rates of the LEDs depicted in FIG. 13A to FIG. 13D.
Figure 17D:
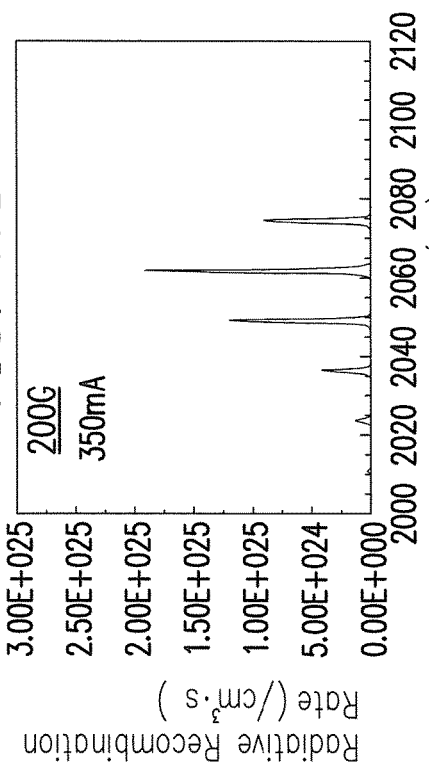
Figure 17A:
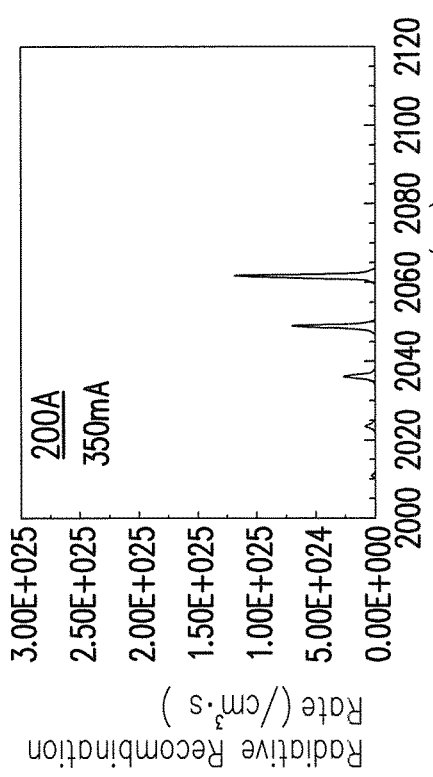
Figure 17C:
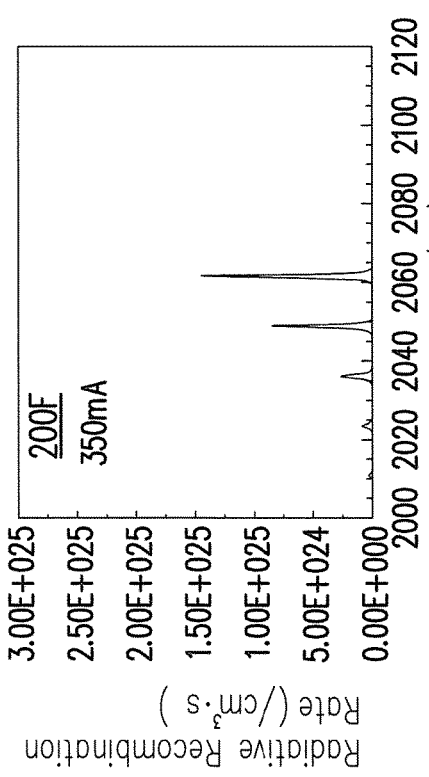

Furthermore, referring to FIG. 16A to FIG. 16D, the hole concentration is increased drastically when the GaN epitaxial layer is inserted between the electron barrier layer and the quantum barrier layer closest to the p-type semiconductor layer to serve as the interlayer (that belongs to the polarization field reversal interlayer type), such as the LED 200E depicted in FIG. 16B and the LED 200G depicted in FIG. 16D.

Further, FIG. 17A to FIG. 17D respectively are simulation diagrams illustrating radiative recombination rates of the LEDs depicted in FIG. 13A to FIG. 13D. From FIG. 17A to FIG. 17D, in the case of the electron barrier layer 270A, 270E having the fixed aluminium concentration, the radiative recombination rate of the LED 200E is higher than the radiative recombination rate of the LED 200A. On the other hand, in the case of the electron barrier layer 270F, 270G comprising the four loops and having the alternate aluminium concentration, the radiative recombination rate of the LED 200G is higher than the radiative recombination rate of the LED 200E. Accordingly, when the polarization field reversal interlayer (such as, the GaN epitaxial layer applied in the present embodiment) is inserted between the electron barrier layer and the quantum barrier layer, the radiative recombination rate may be increased drastically.

The probability of wave-function overlap in each quantum well 234 of the LEDs 200A and 200E-200G in the present embodiment, is simulated and shown in Table 3. Referring to Table 3 and FIG. 13A to FIG. 13D together, the radiative recombination rate of each of the quantum wells in the LED 200F is higher than that of each of the quantum wells in the LED 200A. Moreover, when the GaN epitaxial layer served as the interlayer is inserted between the electron barrier layer and the quantum barrier layer, the radiative recombination rates of three quantum wells 234a-234c (as shown in FIG. 3A and FIG. 3B) close to the p-type semiconductor layer 240 may be increased drastically, in particular, the structure such as the LED 200G may obtain the preferable radiative recombination rate.

TABLE 3

| LED | Quantum Well 234e | Quantum Well 234d | Quantum Well 234c | Quantum Well 234b | Quantum Well 234a |
|---|---|---|---|---|---|
| 200A | 16.62 | 17.47 | 17.64 | 19.24 | 13.1 |
| 200E | 16.66 | 17.55 | 17.83 | 19.71 | 16.81 |
| 200F | 16.63 | 17.5 | 17.71 | 19.42 | 13.47 |
| 200G | 16.66 | 17.54 | 17.82 | 19.7 | 16.92 |

Figure 18:
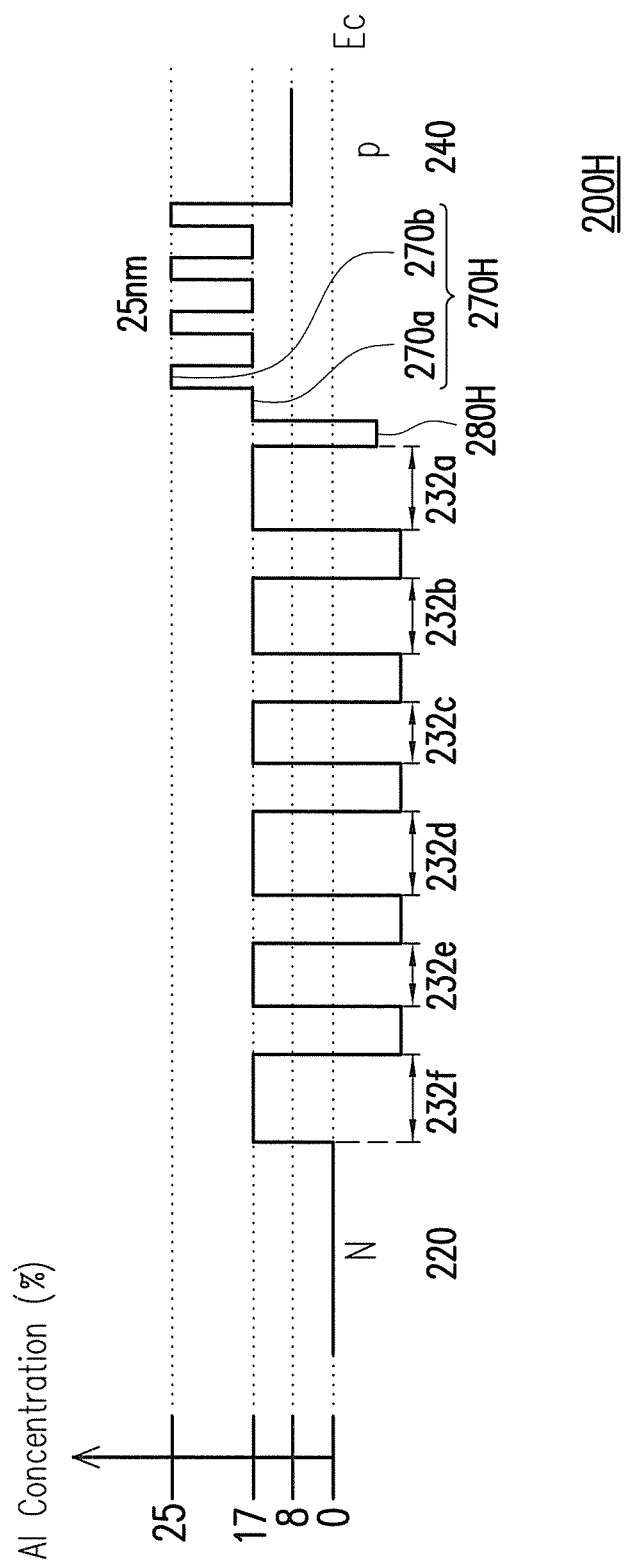
FIG. 18 is a schematic diagram illustrating a structure pattern of an LED according to the second embodiment.

The aforementioned inferences are further illustrated with support from the experimental results described below. Table 4 records the impact on the luminous intensity of the LED when the currents of 350 mA and 700 mA are applied, that results from varying the layer structure between the electron barrier layer and the quantum barrier layer closest to the p-type semiconductor layer in the active layer, for instance, whether the interlayer is inserted therebetween, the elements of the interlayer, or the elements and types of the electron barrier layer. Specifically, the layer structures of the LEDs 200A, 200F and 200G from Table 4 are illustrated in FIG. 13A, FIG. 13C and FIG. 13D, respectively. The layer structure of the LED 200H may be shown in FIG. 18. The composition of the electron barrier layer 270H comprises the afore-described four loops that are derived from the first sub electron barrier layer 270a and the second sub electron barrier layer 270b interchangeably, except that in the electron barrier layer 270H of the LED 200H, the aluminium concentration of the first sub electron barrier layer 270a adjacent to the interlayer 280H is smaller than that of the second sub electron barrier layer 270b.

TABLE 4

| LED | Interlayer Element | Electron Barrier Layer Composition | Electron Barrier Layer Element | Luminous Intensity at 350 mA (mW) | Luminous Intensity at 700 mA (mW) |
|---|---|---|---|---|---|
| 200A | None | electron barrier having a fixed aluminium concentration | $Al_{0.25}Ga_{0.75}N$ | 33.1 | 61.8 |
| 200F | None | Comprising four loops having an alternate aluminium concentration | $Al_{0.25}Ga_{0.75}N/$ $Al_{0.17}Ga_{0.83}N$ | 46.9 | 88.2 |
| 200G | GaN | Comprising four loops having an alternate aluminium oncentration | $Al_{0.25}Ga_{0.75}N/$ $Al_{0.17}Ga_{0.83}N$ | 61.8 | 124.7 |

TABLE 4-continued

| LED | Interlayer Element | Electron Barrier Layer Composition | Element | Luminous Intensity at 350 mA (mW) | Luminous Intensity at 700 mA (mW) |
|---|---|---|---|---|---|
| 200H | GaN | Comprising four loops having an alternate aluminium oncentration | $Al_{0.17}Ga_{0.73}N/$ $Al_{0.25}Ga_{0.75}N$ | 51.3 | 101.2 |

As shown in Table 4 and FIG. 13A, the LED 200A has the luminous intensity of 33.1 mW when the LED 200A having the electron barrier layer 270A (i.e., a layer with a fixed aluminium concentration) is applied. By contrast, as shown in Table 4 and FIG. 13C, when the electron barrier layer is changed to the structure of the four loops as in the LED 200F, the luminous intensity may be increased drastically, from the original 33.1 mW to 46.9 mW. Furthermore, as shown in Table 4 and FIG. 13D, when the electron barrier layer is changed to the structure of the four loops as in the LED 200G, and the GaN epitaxial layer served as the interlayer is inserted between the electron barrier layer and the quantum barrier layer closest to the p-type semiconductor layer 232a, the luminous intensity of the LED 200G may be increased to 51.3 mW. Moreover, as shown in Table 4 and FIG. 18, when the electron barrier layer is changed to the structure 270H of the four loops as in the LED 200H, the aluminium concentration (17%) of the first sub electron barrier layer 270a ($Al_{0.17}Ga_{0.83}N$) adjacent to the interlayer 280H is smaller than the aluminium concentration (25%) of the second sub electron barrier layer 270b ($Al_{0.25}Ga_{0.75}N$), and the luminous intensity of the LED 200H is 51.3 mW. As such, the LED 200H still remain the ability of enhancing the luminous intensity as compared with the LEDs 200A and 200E. Based on the results indicated above, in the electron barrier layer comprising the four loops, a preferable luminous intensity may be obtained by having the aluminium concentration (25%) of the first sub electron barrier layer 270a ($Al_{0.25}Ga_{0.75}N$) adjacent to the interlayer greater than the aluminium concentration (17%) of the second sub electron barrier layer 270b ($Al_{0.17}Ga_{0.83}N$).

It can be seen from the results presented in FIG. 13A-FIG. 13D to FIG. 18 of the second embodiment, Tables 3 and 4 that, the luminous intensity of the LED may be effectively enhanced when the interlayer capable of reversing polarization field (also referred as the polarization filed reversal interlayer hereafter) is inserted between the electron barrier layer and the quantum barrier layer closest to the p-type semiconductor, and the lattice constant of the polarization filed reversal interlayer is greater than the lattice constant of the electron barrier layer. Therefore, the impact on the luminous intensity results from the difference in lattice constants of the polarization filed reversal interlayer, which is further explained below.

As described earlier, the lattice constant of the polarization filed reversal interlayer may be modulated by changing the aluminium and indium concentrations of the polarization filed reversal interlayer material. From the conventional lattice constant formula, $Al_aIn_bGa_{1-a-b}N$, the lattice constants may be calculated as 3.112×a+3.544×b+3.1892×(1-a-b). For example, when the aluminium concentration, a, is equal to 0.17 and the indium concentration is equal to 0, the corresponding lattice constant is 3.1761 Å. When the aluminium concentration, a, is equal to 0.25 and the indium concentration is equal to 0, the corresponding lattice constant is 3.1699 Å; when both the aluminium and indium concentrations are equal to 0, the corresponding lattice constant is 3.1892 Å (the present embodiment); and when the aluminium concentration is equal to 0 and the indium concentration is equal to 0.1, the corresponding lattice constant is 3.2247 Å. In other words, in the present embodiment, when the aluminium concentration gets lower or the indium concentration gets higher in the polarization filed reversal interlayer material, the lattice constant of the polarization filed reversal interlayer becomes greater. In the second embodiment of the disclosure, a material of the polarization filed reversal interlayer is gallium nitride (GaN), and thus the lattice constant of the polarization filed reversal interlayer is greater than that of the electron barrier and the quantum barrier layer. In other words, by having the lattice constant of the polarization filed reversal interlayer greater than the lattice constant of the electron barrier layer, the polarization field direction of the polarization filed reversal interlayer and the electron barrier layer is different from the polarization field direction of the quantum barrier layer and the electron barrier layer, such that the conductive band energy level may be effectively increased to be higher than the Fermi energy level and the potential barrier for holes injection may be reduced so as to improve the hole injection efficiency, thereby enhancing the luminous efficiency of the LED drastically.

In view of the foregoing, in the second embodiment of the disclosure, by inserting the interlayer (that having a lattice constant is different from that of the quantum barrier layer and the electron barrier layer) between the electron barrier layer and the quantum barrier layer closest to the p-type semiconductor layer in the active layer, or by having the thicknesses of the interlayer and the electron barrier layer to satisfy the specific relationship, or by having the lattice constant of the interlayer greater than the lattice constant of the electron barrier layer, holes may be evenly distributed into the quantum wells by employing any one of the afore-described means, so as to increase the carrier recombination rate of the LED. Therefore, in the disclosure, the luminous efficiency of the LED may be enhanced drastically by employing any one of the afore-described means.

Moreover, the LED of the disclosure is not limited to the embodiments depicted above. The LED may be configured with horizontal electrodes or vertical electrodes, both of which can implement the disclosure but should not be construed as limiting the disclosure. For example, the structure of the LED in the disclosure may be implemented, as shown in FIG. 19 to FIG. 20.

Figure 19:
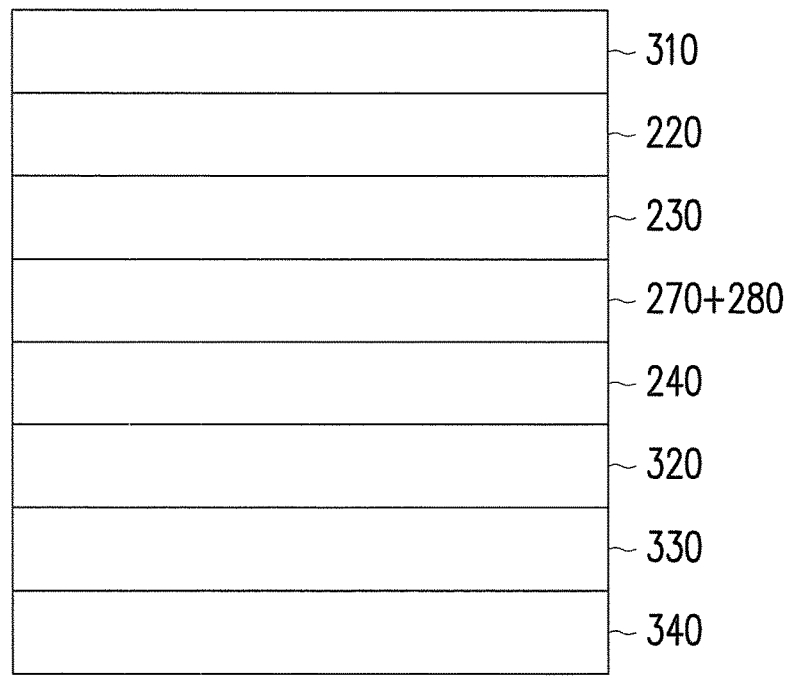
FIG. 19 is an implementation of an LED in the disclosure.

FIG. 19 is an implementation of an LED in the disclosure. As shown in FIG. 19, the LED 300, from top to bottom, sequentially includes a contact layer 310; the n-type semiconductor layer 220, the active layer 230, the electron barrier layer 270, the interlayer 280 and the p-type semiconductor layer 240 that are described above; a reflective layer 320; a bonding layer 330; and a carrier substrate 340.

Figure 20:
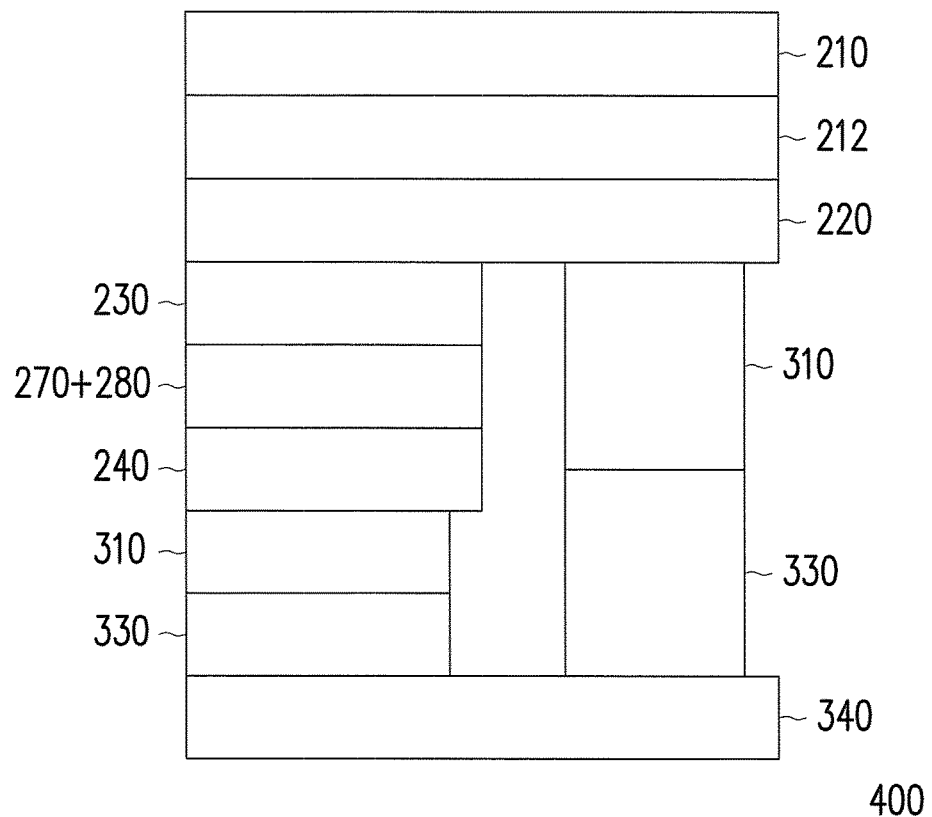
FIG. 20 is another implementation of an LED in the disclosure.

FIG. 20 is another implementation of an LED in the disclosure. As shown in FIG. 20, the LED 400, from top to bottom, sequentially includes the substrate 210, the nitride semiconductor capping layer 212, the n-type semiconductor layer 220, and the carrier substrate 340, in which two stacked layers are sandwiched between the n-type semiconductor layer 220 and the carrier substrate 340. As shown in FIG. 20, the first stacked layer comprises the active layer 230, the electron barrier layer 270, the interlayer 280, the p-type semiconductor layer 240, the contact layer 310 and the bonding layer 330, which is located on the left-hand side of FIG. 20. Furthermore, the second stacked layer is located on the right-hand side of the first stacked layer, and is separated away from the first stacked layer by a distance, in which the second stacked layer comprises the contact layer 310 and the bonding layer 330. Moreover, according to the demand for the components, in the LED 400, a reflective layer may be disposed between the contact layer 310 and the bonding layer 330 of the first stacked layer that is located on the right-hand side of the LED, or the carrier substrate 340 may be disposed adjacent to a surface of the second stacked layer that is located on the left-hand side of the LED, although the disclosure is not limited thereto.

Figure 21:
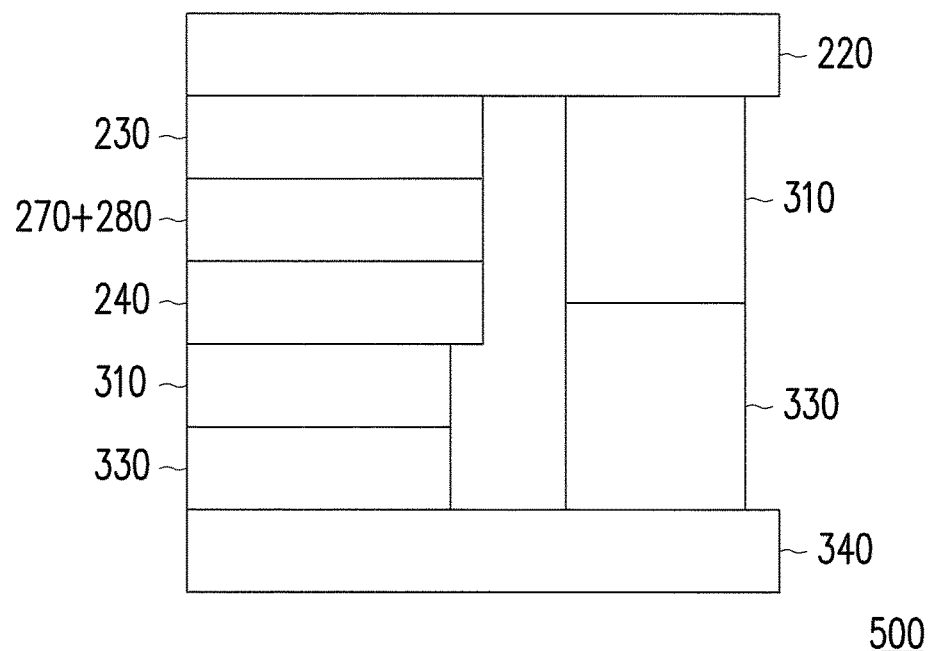
FIG. 21 is yet another implementation of an LED in the disclosure.

FIG. 21 is yet another implementation of an LED in the disclosure. As shown in FIG. 21, the layer structure of the LED 500 is similar to FIG. 20 except that the substrate 210 and the nitride semiconductor capping layer 212 located above the n-type semiconductor layer 220 are omitted in the LED 500 of FIG. 21, as compared with the LED 400 depicted in FIG. 20. Furthermore, the same reference numbers are used in the drawings and the description to refer to the same or like parts, and so further elaboration is omitted. Similarly, according to the demand for the components, in the LED 500, a reflective layer may be disposed between the contact layer 310 and the bonding layer 330 of the first stacked layer that is located on the right-hand side of the LED, or the carrier substrate 340 may be disposed adjacent to a surface of the second stacked layer that is located on the left-hand side of the LED, although the disclosure is not limited thereto.

It should be mentioned that, in the LEDs shown in FIG. 1A and FIG. 19-FIG. 21, the active layer may also be designed to have a first variation design and a second variation design, which are further explained below.

The First Variation Design of the Active Layer

Referring to FIG. 3A and FIG. 3B, a wavelength of light emitted by the active layer is λ, 222 nm≤λ≤405 nm, the active layer includes i quantum barrier layers and (i−1) quantum wells, each of the quantum wells is located between any two of the quantum barrier layers, where i is a natural number greater than or equal to 2. In the first variation design, by having a number of quantum barrier layers of the active layer doped with n-type dopants, in which the layer number of the doped quantum baiiier layers satisfies a specific relationship, or by having the lowest doping concentration at the quantum barrier layer doped with n-type dopants closest to the p-type semiconductor, or by having the doping concentrations of the quantum barrier layers doped with n-type dopants to satisfy a specific relationship, the n-type dopants may compensate for the effect which defects have on the carriers. Accordingly, the carrier recombination rate of the LED may be enhanced. Therefore, by employing any one of the afore-described techniques, the luminous efficiency of the LED may be drastically enhanced at the 222 nm-405 mn wavelength range.

Specifically, in the active layer of the LED, a n-type dopant is doped in at least k layers of the quantum barrier layers, where k is a natural number greater than or equal to 1, when i is an even number, k≥i/2, and when i is an odd number, k≥(i−1)/2. Accordingly, the afore-described effects may be achieved.

In another implementation of the first variation design, as long as the doping concentration of the doped quantum barrier layer closest to the p-type semiconductor layer is smaller than or equal to the doping concentrations of the other quantum barrier layers in the k doped quantum barrier layers, the luminous efficiency of the LED may be enhanced at the 222 nm-405 nm wavelength range.

Additionally, in another implementation of the first variation design, by having a doping concentration of the k quantum barrier layers being from $5 \times 10^{17}/cm^3$ to $1 \times 10^{19}/cm^3$, the luminous efficiency of the LED may be enhanced at the 222 nm-405 nm wavelength range.

With regard of the effects achieved by employing the afore-described techniques in the first variation design, the entire specification of U.S. patent application Ser. No. 13/469,070 is incorporated herein by reference and made a part of this specification.

The Second Variation Design of the Active Layer

Referring to FIG. 3A and FIG. 3B, a wavelength of light emitted by the active layer is λ, 222 nm≤λ≤405 nm, the active layer includes i quantum barrier layers and (i−1) quantum wells, each of the quantum wells is located between any two of the quantum barrier layers, where i is a natural number greater than or equal to 2. In the second variation design, by having a thickness of one of the three quantum barrier layers closest to the p-type semiconductor layer greater than thicknesses of the other two quantum barrier layers, or by having the thickness of the quantum barrier layer in the active layer to satisfy a specific relationship, electron-hole pairs may be evenly distributed into the active layer. Accordingly, the electron-hole recombination rate may be increased. Therefore, by employing any one of the afore-described techniques, the luminous intensity of the LED may be drastically enhanced at the 222 mn-405 mn wavelength range.

Specifically, in the active layer of the LED, a thickness of each of the quantum barrier layers, counting from the p-type semiconductor layer, is $T_1, T_2, T_3 \ldots$, and $T_i$ in sequence, and $T_1$ is greater than $T_2$ and $T_3$ or $T_1 > T_2 = T_3$. Accordingly, the afore-described effects may be achieved.

In another implementation of the second variation design, as long as the thickness of each of the quantum barrier layers, counting from the p-type semiconductor layer, is $T_1, T_2, T_3 \ldots$, and $T_i$ in sequence, and $T_1 = T_2 > T_3$ or $T_1 > T_2 > T_3$, the luminous efficiency of the LED may be enhanced at the 222 nm-405 nm wavelength range. With regard of the effects achieved by employing the afore-described techniques in the second variation design, the entire specification of U.S. patent application Ser. No. 13/481,966 is incorporated herein by reference and made a part of this specification.

It should be mentioned that, in the specifications of U.S. patent application Ser. Nos. 13/469,070 and 13/481,966, silicon is used as the n-type dopant as an exemplary scope for implementation, although people skilled in the art may also use other elements in the same group IVA as silicon or select elements from the group V or VIA (such as oxygen) to substitute the silicon in the embodiments. As long as the elements may replace the elements in the group IIIA such as aluminium, indium and gallium, and are capable of providing electrons for n-type dopants, such elements may be implemented in the embodiments of the disclosure. Moreover, in the embodiments of the disclosure where the emission wavelength is 365 nm, the material of the quantum wells is $In_cGa_{1-c}N$, in which $0 \leq c \leq 0.05$, and the material of the quantum barrier layers is $Al_dGa_{1-d}N$, where d is between 0 to 0.25. Furthermore, in the embodiments of the disclosure, a preferable aluminium concentration is 0.10-0.20, and the thickness of the quantum barrier layer is, for instance, 5 nm-15 nm. The preferable thickness is 6 nm-11 nm in the embodiments of the disclosure.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode, comprising:
    a sapphire substrate;
    a n-type semiconductor layer disposed on the sapphire substrate;
    an active layer having a defect density DD, wherein $DD \geq 2 \times 10^7/cm^2$, the active layer is disposed on a portion of the n-type semiconductor layer, and a wavelength $\lambda$ of light emitted by the active layer is $\lambda \leq 365$ nm, the active layer comprising i quantum barrier layers and (i–1) quantum wells, each of the quantum wells is disposed between any two quantum barrier layers, and is a natural number greater than or equal to 2, wherein a n-type dopant is doped in at least k layers of the quantum barrier layers, and the other (i–k) quantum barrier layers are undoped, k being a natural number greater than or equal to 1, when i is an even number, $k \geq i/2$, and when is an odd number, $k \geq (i-1)/2$;
    a p-type semiconductor layer disposed on the active layer; and
    a first electrode and a second electrode, wherein the first electrode is disposed on a portion of the n-type semiconductor layer, and the second electrode is disposed on a portion of the p-type semiconductor layer,
    wherein the doping concentration of the each of the k quantum barrier layers counting sequentially from the n-type to the p-type semiconductor layer side are $C_1$, $C_2$, ... $C_k$, where $C_k < C_{k-1}$.

2. The light emitting diode as claimed in claim 1, wherein the k quantum barrier layers doped with the n-type dopant are located nearest to the n-type semiconductor layer.

3. The light emitting diode as claimed in claim 1, wherein a material of the quantum barrier layers comprises $Al_xIn_yGa_{1-x-y}N$, wherein $0 \leq x \leq 1$, $0 \leq y \leq 0.3$, and $x+y \leq 1$.

4. The light emitting diode as claimed in claim 1, wherein a thickness of each of the quantum barrier layers is between 5 nm to 15 nm.

5. The light emitting diode as claimed in claim 3, wherein a material of the quantum wells comprises $Al_mIn_nGa_{1-m-n}N$, wherein $0 \leq m < 1$, $0 \leq n \leq 0.5$, $m+n \leq 1$, $x > m$, and $n \geq y$.

6. The light emitting diode as claimed in claim 1, wherein a respective thickness of each of the quantum barrier layers, counting from the p-type semiconductor layer, is $T_1$, $T_2$, $T_3$ ..., and $T_i$ in sequence, and $T_1$ is greater than $T_2$ and $T_3$.

7. A light emitting diode, comprising:
    a sapphire substrate;
    a n-type semiconductor layer disposed on the sapphire substrate;
    an active layer having a defect density DD, wherein $DD \geq 2 \times 10^7/cm^2$, the active layer is disposed on a portion of the n-type semiconductor layer, and a wavelength $\lambda$ of light emitted by the active layer is $\lambda \leq 365$ nm, the active layer comprising i quantum barrier layers and (i–1) quantum wells, each of the quantum wells is disposed between any two quantum barrier layers, and i is a natural number greater than or equal to 2, wherein a n-type dopant is doped in at least k layers of the quantum barrier layers, and the other (i–k) quantum barrier layers are undoped, k being a natural number greater than or equal to 1, when i is an even number, $k \geq i/2$, and when i is an odd number, $k \geq (i-1)/2$;
    a p-type semiconductor layer disposed on the active layer,
        a doping concentration of the quantum barrier layer in the k quantum barrier layers nearest to the p-type semiconductor layer being less than the doping concentration of the other quantum barrier layers in the k quantum barrier layers; and
    a first electrode and a second electrode, wherein the first electrode is disposed on a portion of the n-type semiconductor layer, and the second electrode is disposed on a portion of the p-type semiconductor layer.

8. The light emitting diode as claimed in claim 7, wherein the k quantum barrier layers doped with the n-type dopant are located nearest to the n-type semiconductor layer.

9. The light emitting diode as claimed in claim 8, wherein the doping concentration of the k quantum barrier layers is at least $5 \times 10^{17}/cm^3$.

10. The light emitting diode as claimed in claim 7, wherein a material of the quantum barrier layers comprises $Al_xIn_yGa_{1-x-y}N$, wherein $0 \leq x \leq 1$, $0 \leq y \leq 0.3$, and $x+y \leq 1$.

11. The light emitting diode as claimed in claim 7, wherein a thickness of each of the quantum barrier layers is between 5 nm to 15 nm.

12. The light emitting diode as claimed in claim 10, wherein a material of the quantum wells comprises $Al_mIn_nGa_{1-m-n}N$, wherein $0 \leq m < 1$, $0 \leq n \leq 0.5$, $m+n \leq 1$, $x > m$, and $n \geq y$.

13. The light emitting diode as claimed in claim 7, wherein a respective thickness of each of the quantum barrier layers, counting from the p-type semiconductor layer, is $T_1$, $T_2$, $T_3$ ..., and $T_i$ in sequence, and $T_1$ is greater than $T_2$ and $T_3$.

14. A light emitting diode, comprising:
    a sapphire substrate;
    a n-type semiconductor layer disposed on the sapphire substrate;
    an active layer having a defect density DD, wherein $DD \geq 2 \times 10^7/cm^2$, the active layer is disposed on a portion of the n-type semiconductor layer, and a wavelength $\lambda$ of light emitted by the active layer is $\lambda \leq 365$ nm, the active layer comprising i quantum barrier layers and (i–1) quantum wells, each of the quantum wells is disposed between any two quantum barrier layers, and i is a natural number greater than or equal to 2, wherein a n-type dopant is doped in at least k layers of the quantum barrier layers, and the other (i–k) quantum barrier layers are undoped, k being a natural number greater than or equal to 1, when i is an even number, $k \geq i/2$, when is an odd number, $k \geq (i-1)/2$, and
    a doping concentration of the k quantum barrier layers is from $5 \times 10^{17}/cm^3$ to $1 \times 10^{19}/cm^3$;
    a p-type semiconductor layer disposed on the active layer; and
    a first electrode and a second electrode, wherein the first electrode is disposed on a portion of the n-type semiconductor layer, and the second electrode is disposed on a portion of the p-type semiconductor layer,
    wherein the doping concentration of the each of the k quantum barrier layers counting sequentially from the n-type to the p-type semiconductor layer side are $C_1$, $C_2$, ... $C_k$, where $C_k < C_{k-1}$.

15. The light emitting diode as claimed in claim 14, wherein the k quantum barrier layers doped with the n-type dopant are located nearest to the n-type semiconductor layer.

16. The light emitting diode as claimed in claim 14, wherein the doping concentration of the quantum barrier layer in the k quantum barrier layers nearest to the p-type semiconductor layer is less than or equal to the doping concentration of the other quantum barrier layers in the k quantum barrier layers.

17. The light emitting diode as claimed in claim 14, wherein a thickness of each of the quantum barrier layers is between 5 nm to 15 nm.

18. The light emitting diode as claimed in claim 14, wherein a respective thickness of each of the quantum barrier layers, counting from the p-type semiconductor layer, is $T_1$, $T_2$, $T_3$ ..., and $T_i$ in sequence, and $T_1$ is greater than $T_2$ and $T_3$.

* * * * *